(12) United States Patent
Nakamura et al.

(10) Patent No.: US 9,748,097 B2
(45) Date of Patent: Aug. 29, 2017

(54) COATING LIQUID FOR FORMING METAL OXIDE FILM, METAL OXIDE FILM, FIELD-EFFECT TRANSISTOR, AND METHOD FOR PRODUCING FIELD-EFFECT TRANSISTOR

(71) Applicants: Yuki Nakamura, Tokyo (JP); Naoyuki Ueda, Kanagawa (JP); Shinji Matsumoto, Kanagawa (JP); Mikiko Takada, Kanagawa (JP); Yuji Sone, Kanagawa (JP); Ryoichi Saotome, Kanagawa (JP); Sadanori Arae, Kanagawa (JP); Yukiko Abe, Kanagawa (JP)

(72) Inventors: Yuki Nakamura, Tokyo (JP); Naoyuki Ueda, Kanagawa (JP); Shinji Matsumoto, Kanagawa (JP); Mikiko Takada, Kanagawa (JP); Yuji Sone, Kanagawa (JP); Ryoichi Saotome, Kanagawa (JP); Sadanori Arae, Kanagawa (JP); Yukiko Abe, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/780,190

(22) PCT Filed: Mar. 26, 2014

(86) PCT No.: PCT/JP2014/059695
§ 371 (c)(1),
(2) Date: Sep. 25, 2015

(87) PCT Pub. No.: WO2014/157733
PCT Pub. Date: Oct. 2, 2014

(65) Prior Publication Data
US 2016/0042947 A1    Feb. 11, 2016

(30) Foreign Application Priority Data

Mar. 29, 2013  (JP) ................................. 2013-072954
Mar. 5, 2014   (JP) ................................. 2014-042911
Mar. 20, 2014  (JP) ................................. 2014-058359

(51) Int. Cl.
*H01L 29/10* (2006.01)
*H01L 21/02* (2006.01)
(Continued)

(52) U.S. Cl.
CPC .......... *H01L 21/02628* (2013.01); *C09D 1/00* (2013.01); *C09D 5/24* (2013.01);
(Continued)

(58) Field of Classification Search
CPC ......... H01L 21/02628; H01L 21/02565; H01L 29/24; H01L 29/66969; H01L 29/7869;
(Continued)

(56) References Cited

U.S. PATENT DOCUMENTS 5,724,187 A * 3/1998 Varaprasad ............. B32B 17/06
                                                    359/265
8,859,331 B2 * 10/2014 Kim ......................... H01B 1/08
                                                    257/E21.006
(Continued)

FOREIGN PATENT DOCUMENTS

CN    1998087 A       7/2007
JP    06-098619       4/1994
(Continued)

OTHER PUBLICATIONS

Apr. 27, 2016 Taiwanese official action in connection with Taiwanese Patent Application No. 103111482.
(Continued)

*Primary Examiner* — Yosef Gebreyesus
(74) *Attorney, Agent, or Firm* — Cooper & Dunham LLP

(57) ABSTRACT

To provide a coating liquid for forming a metal oxide film, containing: an indium compound; at least one selected from the group consisting of a magnesium compound, a calcium compound, a strontium compound, and a barium compound; at least one selected from the group consisting of a compound containing a metal a maximum positive value of an oxidation number of which is IV, a compound containing a metal a maximum positive value of an oxidation number of which is V, and a compound containing a metal a maximum positive value of an oxidation number of which is VI; and an organic solvent.

17 Claims, 5 Drawing Sheets

(51) Int. Cl.
  *C09D 1/00* (2006.01)
  *H01L 29/786* (2006.01)
  *H01L 29/66* (2006.01)
  *C09D 5/24* (2006.01)
  *H01L 29/24* (2006.01)

(52) U.S. Cl.
  CPC ........ *H01L 21/02565* (2013.01); *H01L 29/24* (2013.01); *H01L 29/66969* (2013.01); *H01L 29/7869* (2013.01)

(58) Field of Classification Search
  CPC ......... H01L 21/0268; C09D 1/00; C09D 4/24; C09D 7/12; C09D 5/24
  See application file for complete search history.

(56) References Cited

U.S. PATENT DOCUMENTS

| | | | |
|---|---|---|---|
| 2009/0090914 A1 | 4/2009 | Yano et al. | |
| 2009/0173938 A1* | 7/2009 | Honda | H01L 29/7869 257/43 |
| 2010/0294350 A1* | 11/2010 | Ko | H01G 9/2031 136/255 |
| 2011/0006297 A1* | 1/2011 | Inoue | H01L 21/02565 257/43 |
| 2011/0262742 A1* | 10/2011 | Takeuchi | C23C 28/04 428/339 |
| 2012/0037901 A1 | 2/2012 | Mori et al. | |
| 2012/0223302 A1* | 9/2012 | Yukinobu | C09D 1/00 257/43 |
| 2012/0286265 A1* | 11/2012 | Takechi | C23C 14/086 257/43 |
| 2013/0240881 A1 | 9/2013 | Nakamura et al. | |
| 2014/0299877 A1 | 10/2014 | Nakamura et al. | |

FOREIGN PATENT DOCUMENTS

| | | |
|---|---|---|
| JP | 07-320541 | 12/1995 |
| JP | 2003-2650 | 1/2003 |
| JP | 2003002650 A * | 1/2003 |
| JP | 2009-177149 | 8/2009 |
| JP | 2010-258058 | 11/2010 |
| JP | 2013-021289 | 1/2013 |
| JP | 2013-115328 | 6/2013 |
| JP | 2014-120712 | 6/2014 |
| KR | 2012-0120388 | 11/2012 |
| TW | 201227810 A1 | 7/2012 |
| WO | WO2007/058248 A1 | 5/2007 |
| WO | WO2009/081968 A1 | 7/2009 |
| WO | WO2012/073913 A1 | 6/2012 |

OTHER PUBLICATIONS

Si Joon Kim et al., 'The formation of InZnO lattices incorporating Ba for thin-film transistors using a solution process,' Journal of Crystal Growth, vol. 326, Issue 1, 2011.
Doo Hyun Yoon et al., 'Investigation of solution-processed amorphous SrInZnO thin film Transistors,' Journal of Crystal Growth, vol. 326, Issue 1, 2011.
International Search Report Issued Jul. 15, 2014 for counterpart International Patent Application No. PCT/JP2014/059695 filed Mar. 26, 2014.
Korean official action dated Dec. 23, 2016 (with English translation) in connection with corresponding Korean Patent Application No. 10-2015-7030733.
Nov. 25, 2016 Taiwanese official action in corresponding Taiwanese Patent Application No. 103111482.

* cited by examiner

COATING LIQUID FOR FORMING METAL OXIDE FILM, METAL OXIDE FILM, FIELD-EFFECT TRANSISTOR, AND METHOD FOR PRODUCING FIELD-EFFECT TRANSISTOR

TECHNICAL FIELD

The present invention relates a coating liquid for forming a metal oxide film, a metal oxide film, a field-effect transistor, and a method for producing a field-effect transistor.

BACKGROUND ART

Conventionally, a metal oxide, such as antimony-doped tin oxide (ATO), and tin-doped indium oxide (ITO), has been used as a transparent electroconductive film for an electrode of a display element (e.g., a liquid crystal display element, and an electroluminescence display element), or a heat element for preventing a windscreen or window glass of cars, aircrafts, or buildings from clouding or freezing.

It has been recently discovered that an oxide semiconductor, such as ZnO, $In_2O_3$, and In—Ga—Zn—O, which is a type of the metal oxide, is a semiconductor exhibiting high carrier mobility compared to amorphous silicon. Moreover, a development of a field-effective transistor (FET) using such oxide semiconductor for an active layer has been actively conducted.

As for a method for forming a thin film of such metal oxide, vacuum deposition, and sputtering are common. For example, disclosed is a thin semiconductor film, which is formed using a vacuum film forming technique, such as sputtering, contains indium, a positive dyad (particularly, zinc, magnesium, copper, cobalt, nickel, and calcium), and oxygen, and has specific resistance of $10^{-1}$ Ωcm to $10^{8}$ Ωcm (see, for example, PTL 1).

In order to perform this problem, however, it is necessary to prepare a device that is complex and expensive. Moreover, it is difficult to form a thin film of a large area with this method.

As for a method enabling to form a thin film of a large area more simply, therefore, it has been actively developed a metal (semiconductor) nano particle ink, which is prepared by forming metal or semiconductor particles, which are called nano particles each having a diameter of 1 μm or smaller, in a vapor phase or a liquid phase, and dispersing the nano particles in a solvent. However, the metal (semiconductor) nano particle ink cannot avoid separation, aggregation, and segmentation in an ink tank or a flow channel, and it is difficult to secure uniform dispersibility, and storage stability thereof. Therefore, it is difficult to use the metal (semiconductor) nano particle ink over a long period of time. In order to apply the ink, in which metal or alloy nano particles are dispersed, and oxidize the nano particles to the insides thereof through baking, it is necessary to perform baking at high temperature. Therefore, it is difficult to make a composition ratio between the metal element and oxygen uniform. In the case where an ink, in which oxide nano particles are dispersed, is used, moreover, it is difficult to produce nano particles having uniform particle diameters, and to reduce contact resistance between nano particles during baking.

Meanwhile, considered is a coating method using a coating liquid, in which an inorganic metal compound, or an organic metal compound is dissolved in an organic solvent, and other metals are added as an active agent to impart higher electroconductivity. In this case, the compound contained is uniformly dissolved in the solvent, and therefore uneven distribution of a concentration in the coating liquid, or separation in the coating liquid is hardly caused, and the coating liquid can be used over a long period of time. Moreover, a thin film produced using this coating liquid has a uniform composition, and therefore it has excellent uniformity in properties when the thin film is used as an active layer of a field-effect transistor.

For example, for the purpose of forming a thin film having high electroconductivity and transmittance, disclosed is a composition for forming a transparent electroconductive film, which contains an inorganic indium compound, a magnesium compound, and an organic compound that can be coordinated to the indium (see, for example, PTL 2). Moreover, disclosed is a composition for forming a transparent electroconductive film, in which indium nitrate, a condensate of polyhydric alcohol, and an active agent are dissolved in an organic solvent (see, for example, PTL 3).

These disclosed methods are however methods associated with a composition for forming a transparent electroconductive film, and an obtainable transparent electroconductive film does not have sufficient functions as an active layer of a field-effect transistor. Therefore, use of such film is limited.

Furthermore, disclosed are a solution of a metal oxide precursor, in which a metal oxide precursor is an organic metal salt, and the inorganic metal salt is dissolved in a solvent that is water or ethanol, and a method containing applying the solution of a metal oxide precursor onto a base to form oxide semiconductor (see, for example, PTL 4). In this literature, use of the obtained oxide semiconductor for an active layer of a field-effect transistor is discussed.

However, the descriptions of the metal salt in PTL 4 merely list metals excluding elements that are gas at normal temperature and pressure, noble metals, halogens, Group 16 elements, P and As belonging to the Group 15, and radioactive elements, and also describes only that, among the aforementioned metals, it is preferred that at least one selected from the group consisting of indium, tin, and zinc be contained. In accordance with the disclosed method, moreover, the solution of a metal oxide precursor is thinly spread over the base once the solution is applied onto the base, and therefore accuracy of a shape of the obtained oxide semiconductor is low.

Furthermore, researched is, in a case where a film of a desired shape is directly formed by a printing process, such as inkjet printing, nano imprinting, and gravure printing, a system where printing is performed in a roll-to-roll processing using a plastic substrate, such as polycarbonate (PC), polyimide (PI), polyethylene terephthalate (PET), and polyethylene naphthalate (PEN), or a thin plate glass having a thickness of 50 μm to 70 μm. In this case, reduction in the process temperature is strongly desired for considering thermal resistance, or reducing thermal elongation of the substrate.

Accordingly, there is currently a need for a coating liquid for forming a metal oxide film, with which a metal oxide film having desired volume resisitivity can be produced easily at low process temperature and into a large area, and with which a desired shape of a metal oxide film can be formed with high accuracy.

CITATION LIST

Patent Literature

PTL 1: International Publication No. WO 2007/058248
PTL 2: Japanese Patent Application Laid-Open (JP-A) No. 06-96619
PTL 3: JP-A No. 07-320541
PTL 4: JP-A No. 2009-177149

SUMMARY OF INVENTION

Technical Problem

The present invention aims to solve the aforementioned various problems in the art, and to achieve the following object. The object of the present invention is to provide a coating liquid for forming a metal oxide film, which can simply produce a large area of a metal oxide film having desirable volume resistivity at low process temperature, and can accurately form a desired shape of a metal oxide film.

Solution to Problem

The means for solving the aforementioned problems is as follows.

The coating liquid for forming a metal oxide film according to the present invention contains:

an indium compound;

at least one selected from the group consisting of a magnesium compound, a calcium compound, a strontium compound, and a barium compound;

at least one selected from the group consisting of a compound containing a metal a maximum positive value of an oxidation number of which is IV, a compound containing a metal a maximum positive value of an oxidation number of which is V, and a compound containing a metal a maximum positive value of an oxidation number of which is VI; and an organic solvent.

Advantageous Effects of Invention

The present invention can solve the aforementioned various problems in the art, and can provide a coating liquid for forming a metal oxide film, which can simply produce a large area of a metal oxide film having desirable volume resistivity at low process temperature, and can accurately form a desired shape of a metal oxide film.

Figure 1:
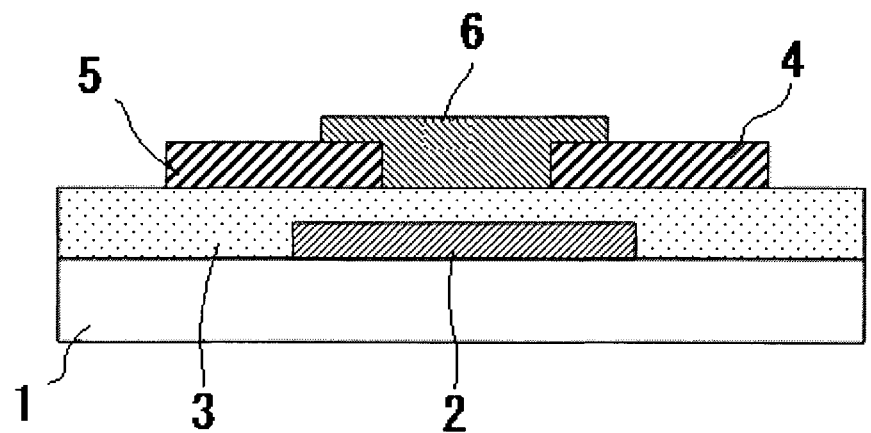
FIG. 1 is a schematic structure diagram illustrating one example of a bottom gate/bottom contact field-effect transistor.

DESCRIPTION OF EMBODIMENTS (Coating Liquid for Metal Oxide Film)

The coating liquid for forming a metal oxide film according to the present invention at least contains: an indium compound; at least one selected from the group consisting of a magnesium compound, a calcium compound, a strontium compound, and a barium compound; at least one selected from the group consisting of a compound containing a metal a maximum positive value of an oxidation number of which is IV, a compound containing a metal a maximum positive value of an oxidation number of which is V, and a compound containing a metal a maximum positive value of an oxidation number of which is VI; and an organic solvent. The coating liquid may further contain other components according to the necessity.

The coating liquid for forming a metal oxide film is preferably a coating liquid, in which an organic metal compound or an inorganic metal compound is dissolved in an organic solvent. The organic metal compound and the inorganic metal compound are not limited as long as they can be uniformly dissolved in the organic solvent, and may form ions as dissociated. In the case where the organic metal compound or the inorganic metal compound is dissolved in the coating liquid for forming a metal oxide film, separation or uneven distribution of the concentration in the coating liquid for forming a metal oxide film is hardly caused, and therefore the coating liquid for forming a metal oxide film can be used over a long period of time. Moreover, a thin film produced using the coating film has a uniform composition, and therefore, in the case where the thin film is used as an active layer of a field-effect transistor, the thin film has excellent uniformity in properties thereof.

Use of the coating liquid for forming a metal oxide film can provide a metal oxide film having desirable volume resistivity.

Note that, the coating liquid for forming a the metal oxide film can also control volume resistivity of a resulting metal oxide film (e.g., an oxide semiconductor film) with conditions thereof, such as a type of a solvent in which ingredients are dissolved, and a concentration of a metal compound. Moreover, volume resistivity thereof can also controlled by substituting part of each element constituting an In—Mg based oxide, an In—Ca based oxide, an In—Sr based oxide, and an In—Ba based oxide with a metal element, such as tin, molybdenum, antimony, and tungsten.

Furthermore, volume resistivity thereof can be controlled by conditions of a heat treatment performed after coating, specifically, baking temperature, baking duration, heating speed, cooling speed, and atmosphere (gas fraction, and pressure) of baking.

Moreover, decomposition of rat material and an accelerating effect of a reaction due to light can be also utilized. As volume resistivity thereof changes with annealing performed after forming a film, a method for optimizing annealing temperature or atmosphere is also effective.

<Indium Compound>

The indium compound is appropriately selected depending on the intended purpose without any limitation, and examples thereof include an organic indium compound, and an inorganic indium compound.

—Organic Indium Compound—

The organic indium compound is appropriately selected depending on the intended purpose without any limitation, provided that it is a compound containing indium and an organic group. The indium and the organic group are bonded together, for example, an ionic bond, a covalent bond, or a coordinate bond.

The organic group is appropriately selected depending on the intended purpose without any limitation, and examples thereof include an alkoxy group, which may contain a substituent, an acyloxy group, which may contain a substituent, and an acetylacetonato group, which may contain a substituent. Examples of the alkoxy group include a C1-C6 alkoxy group. Examples of the acyloxy group include a C1-C10 acyloxy group.

Examples of the substituent include halogen, and a tetrahydrofuryl group.

Examples of the organic indium compound include triethoxy indium, indium 2-ethylhexanoate, and indium acetylacetonate.

—Inorganic Indium Compound—

The inorganic indium compound is appropriately selected depending on the intended purpose without any limitation, and examples thereof include indium oxoacid, halogenated indium, indium hydroxide, and indium cyanidate.

Examples of the indium oxoacid include indium nitrate, indium sulfate, indium carbonate, and indium phosphate.

Examples of the halogenated indium include indium chloride, indium bromide, and indium iodide.

Among them, preferred are indium oxoacid and halogenated indium as they have high solubility to various solvents, and more preferred are indium nitrate, indium sulfate, and indium chloride.

The indium nitrate is appropriately selected depending on the intended purpose without any limitation, and examples thereof include indium nitrate hydrate. Examples of the indium nitrate hydrate include indium nitrate trihydrate, indium nitrate pentahydrate.

The indium sulfate is appropriately selected depending on the intended purpose without any limitation, and examples thereof include indium sulfate anhydrate, and indium sulfate hydrate. Examples of the indium sulfate hydrate include indium sulfate nonahydrate.

The indium chloride is appropriately selected depending on the intended purpose without any limitation, and examples thereof include indium chloride hydrate. Examples of the indium chloride hydrate include indium chloride tetrahydrate.

These indium compounds may be synthesized for use, or selected from commercial products.

<Magnesium Compound>

The magnesium compound is appropriately selected depending on the intended purpose without any limitation, and examples thereof include an organic magnesium compound, and an inorganic magnesium compound.

—Organic Magnesium Compound—

The organic magnesium compound is appropriately selected depending on the intended purpose without any limitation, provided that it is a compound containing magnesium and an organic group. The magnesium and the organic group are bonded together, for example, an ionic bond, a covalent bond, or a coordinate bond.

The organic group is appropriately selected depending on the intended purpose without any limitation, and examples thereof include the organic groups listed in the descriptions of the organic indium compound.

Examples of the organic magnesium compound include magnesium 2-ethylhexanoate, magnesium ethoxide, magnesium methoxide, magnesium methoxyethoxide, and magnesium acetylacetonate.

—Inorganic Magnesium Compound—

The inorganic magnesium compound is appropriately selected depending on the intended purpose without any limitation, and examples thereof include magnesium oxoacid, halogenated magnesium, magnesium hydroxide, and magnesium cyanidate.

Examples of the magnesium oxoacid include magnesium nitrate, magnesium sulfate, magnesium carbonate, and magnesium phosphate.

Examples of the halogenated magnesium include magnesium chloride, magnesium bromide, and magnesium iodide.

Among them, preferred are magnesium oxoacid, and halogenated magnesium as they have high solubility to various solvent, and more preferred are magnesium nitrate, magnesium sulfate, and magnesium chloride.

The magnesium nitrate is appropriately selected depending on the intended purpose without any limitation, and examples thereof include magnesium nitrate hydrate. Examples of the magnesium nitrate hydrate include magnesium nitrate trihydrate, and magnesium nitrate hexahydrate.

The magnesium sulfate is appropriately selected depending on the intended purpose without any limitation, and examples thereof include magnesium sulfate hydrate. Examples of the magnesium sulfate hydrate include magnesium sulfate monohydrate, and magnesium sulfate heptahydrate.

The magnesium chloride is appropriately selected depending on the intended purpose without any limitation, and examples thereof include magnesium chloride hydrate. Examples of the magnesium chloride hydrate include magnesium chloride hexahydrate.

These magnesium compounds may be synthesized for use, or selected from commercial products.

<Calcium Compound>

The calcium compound is appropriately selected depending on the intended purpose without any limitation, and examples thereof include an organic calcium compound, and an inorganic calcium compound.

—Organic Calcium Compound—

The organic calcium compound is appropriately selected depending on the intended purpose without any limitation, provided that it is a compound including calcium and an organic group. The calcium and the organic group are bonded together for example, through an ionic bond, a covalent bond, or coordinate bond.

The organic group is appropriately selected depending on the intended purpose without any limitation, and examples thereof include the organic groups listed in the descriptions of the organic indium compound.

Examples of the organic calcium compound include calcium 2-ethylhexanoate, calcium ethoxide, calcium methoxide, calcium methoxyethoxide, and calcium acetylacetonate.

—Inorganic Calcium Compound—

The inorganic calcium compound is appropriately selected depending on the intended purpose without any limitation, and examples thereof include calcium oxoacid, halogenated calcium, calcium hydroxide, and calcium cyanidate.

Examples of the calcium oxoacid include calcium nitrate, calcium sulfate, calcium carbonate, and calcium phosphate.

Examples of the halogenated calcium include calcium chloride, calcium bromide, and calcium iodide.

Among them, preferred are calcium oxoacid and halogenated calcium as they have high solubility to various solvents, and more preferred are calcium nitrate, calcium sulfate, and calcium chloride.

The calcium nitrate is appropriately selected depending on the intended purpose without any limitation, and examples thereof include calcium nitrate hydrate. Examples of the calcium nitrate hydrate include calcium nitrate trihydrate, calcium nitrate tetrahydrate, and calcium nitrate hexahydrate.

The calcium sulfate is appropriately selected depending on the intended purpose without any limitation, and examples thereof include calcium sulfate hydrate. Examples of the calcium sulfate hydrate include calcium sulfate monohydrate, calcium sulfate heptahydrate.

The calcium chloride is appropriately selected depending on the intended purpose without any limitation, and examples thereof include calcium chloride hydrate. Examples of the calcium chloride hydrate include calcium chloride hexahydrate.

These calcium compounds may be synthesized for use, or selected from commercial products.

<Strontium Compound>

The strontium compound is appropriately selected depending on the intended purpose without any limitation, and examples thereof include an organic strontium compound, and an inorganic strontium compound.

—Organic Strontium Compound—

The organic strontium compound is appropriately selected depending on the intended purpose without any limitation, provided that it is a compound containing strontium and an organic group. The strontium and the organic group are bonded together, for example, an ionic bond, a covalent bond, or a coordinate bond.

The organic group is appropriately selected depending on the intended purpose without any limitation, and examples thereof include the organic groups listed in the descriptions of the organic indium compound.

Examples of the organic strontium compound include strontium 2-ethylhexanoate, strontium ethoxide, strontium methoxide, strontium methoxyethoxide, and strontium acetylacetonate.

—Inorganic Strontium Compound—

The inorganic strontium compound is appropriately selected depending on the intended purpose without any limitation, and examples thereof include strontium oxoacid, halogenated strontium, strontium hydroxide, and strontium cyanidate.

Examples of the strontium oxoacid include strontium nitrate, strontium sulfate, strontium carbonate, and strontium phosphate.

Examples of the halogenated strontium include strontium chloride, strontium bromide, and strontium iodide.

Among them, preferred are strontium oxoacid and halogenated strontium as they have high solubility to various solvents, and more preferred are strontium nitrate, strontium sulfate, and strontium chloride.

The strontium nitrate is appropriately selected depending on the intended purpose without any limitation, and examples thereof include strontium nitrate hydrate. Examples of the strontium nitrate hydrate include strontium nitrate trihydrate, and strontium nitrate hexahydrate.

The strontium sulfate is appropriately selected depending on the intended purpose without any limitation, and examples thereof include strontium sulfate anhydrate, and strontium sulfate hydrate. Examples of the strontium sulfate hydrate include strontium sulfate dihydrate, and strontium sulfate heptahydrate.

The strontium chloride is appropriately selected depending on the intended purpose without any limitation, and examples thereof include strontium chloride anhydrate, and strontium chloride hydrate. Examples of the strontium chloride hydrate include strontium chloride dihydrate, strontium chloride tetrahydrate, and strontium chloride hexahydrate.

These strontium compounds may be synthesized for use, or selected from commercial products.

<Barium Compound>

The barium compound is appropriately selected depending on the intended purpose without any limitation, and examples thereof include an organic barium compound, and an inorganic barium compound.

—Organic Barium Compound—

The organic barium compound is appropriately selected depending on the intended purpose without any limitation, provided that it is a compound containing barium and an organic group. The barium and the organic group are bonded together, for example, an ionic bond, a covalent bond, or a coordinate bond.

The organic group is appropriately selected depending on the intended purpose without any limitation, and examples thereof include the organic groups listed in the descriptions of the organic indium compound.

Examples of the organic barium compound include, barium bistetrahydrofurfuryloxide, barium 2-ethylhexanoate, and barium acetylacetonate.

—Inorganic Barium Compound—

The inorganic barium compound is appropriately selected depending on the intended purpose without any limitation, and examples thereof include barium oxoacid, halogenated barium, barium hydroxide, and barium cyanidate.

Examples of the barium oxoacid include barium nitrate, barium acetate, barium carbonate, and barium phosphate.

Examples of the halogenated barium include barium chloride, barium bromide, and barium iodide.

The barium chloride is appropriately selected depending on the intended purpose without any limitation, and examples thereof include barium chloride anhydrate, and barium chloride hydrate. Examples of the barium chloride hydrate include barium chloride dihydrate.

The barium bromide is appropriately selected depending on the intended purpose without any limitation, and examples thereof include barium bromide anhydrate, and barium bromide hydrate. Examples of the barium bromide hydrate include barium bromide dihydrate.

The barium iodide is appropriately selected depending on the intended purpose without any limitation, and examples thereof include barium iodide anhydrate, and barium iodide hydrate. Examples of the barium iodide hydrate include barium iodide monohydrate, and barium iodide dihydrate.

Among them, preferred are barium bistetrahydrofurfuryloxide, barium nitrate, barium carbonate, barium acetate, barium hydroxide, barium chloride, barium bromide, and barium iodide as they have high solubility to various solvents, and more preferred are barium bistetrahydrofurfuryloxide, barium chloride, barium bromide, and barium iodide.

These barium compounds may be synthesized for use, or selected from commercial products.

<Compound Containing Metal Maximum Positive Value of Oxidation Number of which is IV, Compound Containing Metal Maximum Positive Value of Oxidation Number of which is V, and Compound Containing Metal Maximum Positive Value of Oxidation Number of which is VI>

The compound containing a metal a maximum positive value of an oxidation number of which is IV is appropriately selected depending on the intended purpose without any limitation, and examples thereof include an organic metal compound, and an inorganic metal compound.

Examples of the metal whose maximum positive value of the oxidation number is IV include germanium, tin, titanium, zirconium, and hafnium.

The compound containing a metal a maximum positive value of an oxidation number of which is V is appropriately selected depending on the intended purpose without any limitation, and examples thereof include an organic metal compound, and an inorganic metal compound.

Examples of the metal whose maximum positive value of the oxidation number is V include vanadium, niobium, tantalum, and antimony.

The compound containing a metal a maximum positive value of an oxidation number of which is VI is appropriately selected depending on the intended purpose without any limitation, and examples thereof include an organic metal compound, and an inorganic metal compound.

Examples of the metal whose maximum positive value of the oxidation number is VI include molybdenum, and tungsten.

The metals in the compound containing a metal a maximum positive value of an oxidation number of which is IV, the compound containing a metal a maximum positive value of an oxidation number of which is V, and the compound containing a metal a maximum positive value of an oxidation number of which is VI do not necessarily have the positive maximum value of the oxidation in the compound.

It is preferred that the metal take the positive maximum value of the oxidation number when the metal is mixed, dissolved, or baked with other raw materials.

—Organic Metal Compound—

The organic metal compounds in the compound containing a metal a maximum positive value of an oxidation number of which is IV, the compound containing a metal a maximum positive value of an oxidation number of which is V, and the compound containing a metal a maximum positive value of an oxidation number of which is VI are appropriately selected depending on the intended purpose without any limitation, provided that they are each a compound containing the metal and an organic group. The metal and the organic group are bonded together, for example, an ionic bond, a covalent bond, or a coordinate bond.

The organic group is appropriately selected depending on the intended purpose without any limitation, and examples thereof include the organic groups listed in the descriptions of the organic indium compound.

Examples of the organic metal compound include metal 2-ethylhexanoate, metal ethoxide, metal methoxide, metal methoxyethoxide, metal acetate, and metal acetylacetonate.

—Inorganic Metal Compound—

Examples of the inorganic metal compound in each of the compound containing a metal a maximum positive value of an oxidation number of which is IV, the compound containing a metal a maximum positive value of an oxidation number of which is V, and the compound containing a metal a maximum positive value of an oxidation number of which is VI include a metal salt of oxoacid, a halogenated metal, metal hydroxide, metal oxide, metal oxychloride, a carbonyl metal, and metal cyanidate.

Examples of the metal salt of oxoacid include a metal salt of nitric acid, a metal salt of sulfuric acid, a metal salt of carbonic acid, and metal salt of phosphoric acid.

Examples of the halogenated metal include metal chloride, metal bromide, and metal iodide.

Among them, preferred are the metal salt of oxoacid, and the halogenated metal as they have high solubility to various solvents, and more preferred are the metal salt of nitric acid, and the metal chloride.

These compounds may be synthesized for use, or selected from commercial products.

In order to achieve a n-type substitution doping with the metal whose the maximum positive value of the oxidation number is IV, the metal whose the maximum positive value of the oxidation number is V, and the metal whose the maximum positive value of the oxidation number is VI, it is necessary that a substitution cation having larger valency is introduced into a cation side to be substituted, and the local order is maintained. Even in the case where it appears to be amorphous (there is no periodicity in a long distance structure) by X-ray diffraction, a short distance structure and a middle distance structure are maintained. Therefore, a carrier is generated, as long as a dopant of an appropriate energy level can be introduced into a cation side to be substituted. An electron carrier can be generated by substituting a bivalent magnesium ion, a bivalent calcium ion, a bivalent strontium ion a bivalent barium ion, or a trivalent indium ion with a dopant having a larger valency, that is, at least one selected from the group consisting of a tetravalent metal ion, a pentavalent metal ion, and a hexavalent metal ion, to thereby perform n-type doping.

A number of indium atoms (A) of the indium compound, and a total (B) of a number of magnesium atoms of the magnesium compound, a number of calcium atoms of the calcium compound, a number of strontium atoms of the strontium compound, and a number of barium atoms of the barium compound in the coating liquid for forming a metal oxide film preferably satisfy the following formula (1).

$$0.04 \leq [B/A] \leq 0.5 \qquad \text{Formula (1)}$$

Note that, the indium atom, the magnesium atom, the calcium atom, the strontium atom, and the barium atom may be in the ionic state.

Moreover, a number (A) of indium atoms of the indium compound and a total (C) of metal (D metal) atoms of the compound containing a metal a maximum positive value of an oxidation number of which is IV, the compound containing a metal a maximum positive value of an oxidation number of which is V, and the compound containing a metal a maximum positive value of an oxidation number of which is VI in the coating liquid for forming a metal oxide film preferably satisfy the following formula (2).

$$0.0001 \leq [C/A] \leq 0.1 \qquad \text{Formula (2)}$$

Note that, the indium atom, and the D metal atom may be in the ionic state.

The coating liquid for forming a metal oxide film, which satisfies the formula (1), or the formula (2), or both thereof can be determined as a coating liquid for forming an oxide semiconductor film.

It has been known that an indium oxide film formed by sputtering can achieve low resistivity, i.e., about $10^{-3}$ $\Omega$cm to about $10^{-4}$ Ωcm, through addition of a few percents to about 20% of tin, zinc, or gallium. However, the film of such low volume resistivity does not effectively function as an active layer of a field-effect transistor.

The volume resistivity of the oxide semiconductor film formed by applying the coating liquid for forming a metal oxide film can be controlled to the volume resistivity with which the oxide semiconductor film can effectively function as an active layer of a field-effect transistor, as the coating liquid for forming a metal oxide film satisfies the formula (1), or the formula (2), or both thereof, preferably satisfying both the formulae (1) and (2).

When the [B/A] is less than 0.04, or greater than 0.5, volume resistivity of a resulting oxide semiconductor film is too high, and therefore a field-effect transistor using such oxide semiconductor film as an active layer has a low on/off ratio, and may not exhibit excellent transistor properties.

When the [C/A] is less than 0.0001, a resulting oxide semiconductor film is sensitively influenced by oxygen deficiency, and therefore a process margin for attaining excellent properties may become narrow. When the [C/A] is greater than 0.1, volume resistivity of a resulting oxide semiconductor film increases to lower mobility, and uniformity may be impaired as added elements are segregated.

An oxide semiconductor film used as an active layer of a field-effect transistor that is used for a driving circuit of a display is required to have high carrier mobility, and to have so-called normally-off properties. In order to achieve high carrier mobility and normally-off properties, it is preferred that the volume resistivity of the oxide semiconductor film be controlled to the range of $10^{-2}$ Ωcm and $10^9$ Ωcm.

In the case where the volume resistivity of the metal oxide film used as the active layer is high, it is difficult to realize high carrier mobility in the on-state created by controlling the gate voltage. Therefore, the volume resistivity of the metal oxide film is more preferably $10^6$ Ωcm or lower.

In the case where the volume resistivity of the metal oxide film used as the active layer is low, it is difficult to control Ids (electric current between drain and source) in the off-state created by controlling the gate voltage. Therefore, the volume resistivity of the metal oxide film is more preferably $10^{-1}$ Ωcm or greater.

The volume resistivity ρ(Ωcm) of the metal oxide is determined according to the following formula (3).

$$\rho = 1/nQ\mu \quad \text{Formula (3)}$$

In the formula (3), Q(C) is carrier charge, n (number/m³) is a carrier density, and μ(m²/V/s) is a carrier mobility.

Accordingly, volume resistivity can be controlled by varying these n, Q, and μ.

Specific example of the method for controlling the volume resistivity of the metal oxide film typically include a method, in which a carrier density is varied by adjusting an oxygen content (a concentration of oxygen defects) in the film, and a method, in which a carrier density is varied by substituting part of cations with cations having different valency.

Particularly, carriers can be efficiently generated by substituting bivalent or trivalent unsubstituted cations in the metal oxide film with substituting cations having larger valency. Therefore, it is not necessary to generate carriers in a baking process as a result of increasing oxygen deficiency, and hence the process temperature can be made low.

As for a method for controlling volume resistivity of an oxide semiconductor film formed from the coating liquid for forming a metal oxide film, the most effective is satisfying the formulae (1) and (2). By satisfying the formulae (1) and (2), an oxide semiconductor film, which is effective as an active layer of a field-effect transistor, can be attained.

<Organic Solvent>

The organic solvent is appropriately selected depending on the intended purpose without any limitation, but the organic solvent is preferably glycol ether, and/or diol. Specifically, the coating liquid for forming a metal oxide film preferably contains the glycol ether, or the diol, or both thereof.

—Glycol Ether—

Use of the glycol ether in the coating liquid for forming a metal oxide film can contributes to form a metal oxide film (e.g., an oxide semiconductor film) having high uniformity and less defects, as the glycol ether dissolves the indium compound, the magnesium compound, the calcium compound, the strontium compound, the barium compound, the compound containing a metal a maximum positive value of an oxidation number of which is IV, the compound containing a metal a maximum positive value of an oxidation number of which is V, and the compound containing a metal a maximum positive value of an oxidation number of which is VI, very well, and stability after dissolving is high.

Moreover, use of the glycol ether in the metal oxide film realizes formation of a desired shape of a metal oxide film (e.g., an oxide semiconductor) with high accuracy.

The glycol ether is considered to function as a reducing agent. As an In—Mg based oxide semiconductor that is a n-type semiconductor, an In—Ca based oxide semiconductor that is a n-type semiconductor; an In—Sr based oxide semiconductor that is a n-type semiconductor, and an In—Ba based oxide semiconductor that is a n-type semiconductor generate conducting electrons, as oxygen defects are generated. Therefore, these materials become materials of high conductivity when an equivalent is shifted to the reduction side. Since the coating liquid for forming a metal oxide film contains the glycol ether, therefore, reduction is caused during a heat treatment performed after coating, to thereby produce an oxide semiconductor film having lower volume resistivity.

The glycol ether is appropriately selected depending on the intended purpose without any limitation, but it is preferably alkylene glycol monoalkyl ether. A number of carbon atoms of the glycol ether is preferably 3 to 6.

The alkylene glycol monoalkyl ether is preferably at least one selected from the group consisting of ethylene glycol monoethyl ether, ethylene glycol monomethyl ether, ethylene glycol monopropyl ether, ethylene glycol monoisopropyl ether, ethylene glycol monobutyl ether, and ethylene glycol monoisobutyl ether. These alkylene glycol monoalkyl ethers have a boiling point, which is not so high, i.e., about 120° C. to about 180° C. and have high evaporation speed hence dry quickly. Therefore, the coating liquid for forming a metal oxide film using any of these alkylene glycol monoalkyl ethers does not undesirably spread by wetting. Use of the aforementioned preferable compound can reduces baking temperature, and can achieve baking within a relatively short period. Moreover, a metal oxide film (e.g., an oxide semiconductor film) has fewer impurities, such as carbon, and organic matter, after baking. As a result, carrier mobility increases. In a graph depicting a relationship between gate voltage Vgs and electric current Ids between a source electrode and a drain electrode of a field-effect transistor using the oxide semiconductor film as an active layer, therefore, a gradient of raising when switching from off to on increases, which makes switching properties excellent, to thereby lower driving voltage to attain necessary on-current.

These may be used alone, or in combination.

In the case where a solvent having a relatively high boiling point, such as the diol, is mixed with the alkylene glycol monoalkyl ether, for example, a substantial amount of the high boiling point solvent is evaporated together with the low boiling point solvent due to azeotropy. Therefore, an effect of promptly frying the coating liquid for forming a metal oxide film can be expected. As the coating liquid, which has been ejected by inkjet printing, and spread by jetting on a substrate, is promptly evaporated, the metal oxide, which has been dissolved in the coating liquid, is precipitated as a uniform composition, and the composition of the metal oxide film obtained after baking is made uniform. Moreover, a shape of the metal oxide film during drying is a shape which has less irregularity and is relatively smooth.

In the case where the coating liquid for forming a metal oxide film contains only a solvent having a high boiling point, or the high boiling point solvent content in the entire solvent for the coating liquid for forming a metal oxide film is excessively high, it takes a long time to dry the coating liquid jetted on a substrate, and therefore it is difficult to control a shape of a film after drying. In the case where it is necessary to overlap printing in one position to form the metal oxide film of a large thickness, it is difficult to control a shape of a film along a direction of the substrate surface and a direction of the film thickness, as the coating liquid is printed and overlapped on the coating liquid deposited on the surface of the substrate before the solvent is evaporated.

In the case where a low boiling point solvent having a small molecular weight is used in the coating liquid for forming a metal oxide film, volatility of the coating liquid is high. Therefore, the solvent is easily evaporated inside an inkjet nozzle, or at an edge of a nozzle, and hence a concentration of the coating liquid (ink) may be changed to precipitate the components contained therein, or to cause nozzle clogging.

An amount of the glycol ether in the coating liquid for forming a metal oxide film is appropriately selected depending on the intended purpose without any limitation, but the amount thereof is preferably 10% by mass to 80% by mass. When the amount thereof is less than 10% by mass, the aforementioned effects (an effect of forming a metal oxide film having high uniformity and fewer defects, an effect of forming a metal oxide film of a desirable shape with high accuracy, and an effect of providing an oxide semiconductor film having lower volume resisitivity) may not be attained. When the amount thereof is greater than 80% by mass, a thickness of a metal oxide film (e.g., an oxide semiconductor film) formable by one coating may become thin.

—Diol—

The glycol ether is preferably used in combination with diol. When the glycol ether is used in combination with the diol, clogging of an inkjet nozzle, which can be caused with drying of the solvent, can be prevented owing to the function of the diol, in the case where the coating liquid for forming a metal oxide film is applied by inkjet printing. Moreover, the coating liquid deposited on a base or the like is promptly dried because of the function of the glycol ether, and spreading of the coating liquid to unnecessary areas can be inhibited. When a field-effect transistor is produced, for example, the coating liquid deposited on a channel is promptly dried to thereby prevent the coating liquid from spreading to the area other than the channel region.

Since the glycol ether is typically low viscous, i.e., having a viscosity of about 1.3 cP to about 3.5 cP, the viscosity of the coating liquid for forming a metal oxide film can be easily adjusted by mixing with the diol which has a high viscosity.

It is considered that the diol is coordinated with an indium salt, a magnesium salt, a calcium salt, a strontium salt, a barium salt, and a dopant metal salt, and functions to enhance thermal stability of the metal salt.

The diol is appropriately selected depending on the intended purpose without any limitation, but it is preferably alkane diol, and dialkylene glycol. A number of carbon atoms of the diol is preferably 2 to 4. When the number of carbon atoms is 5 or higher, volatility thereof is low, the diol tends to be remained in a formed metal oxide film (e.g., an oxide semiconductor film), and therefore a compactness of the metal oxide film (e.g., the oxide semiconductor film) after baking may reduce. In the case where the oxide semiconductor film having low compactness is used, moreover, carrier mobility reduces, and therefore, on-current may reduce.

Since the C2-C4 diol has a boiling point of about 180° C. to about 250° C., the diol is evaporated during baking performed after applying the coating liquid for forming a metal oxide film, and thus the diol is hardly remained in a resulting metal oxide film (e.g., an oxide semiconductor film). The C2-C4 diol has a viscosity of about 10 cP to about 110 cP, and therefore there is an effect of suppressing spreading of the coating liquid for forming a metal oxide film as the coating liquid is landed on a substrate or the like, in the case where the coating liquid is applied, for example, by inkjet printing.

The diol is more preferably at least one selected from the group consisting of diethylene glycol, 1,2-ethanediol, 1,2-propanediol, and 1,3-butanediol, in view of baking temperature, and compactness of a metal oxide film (e.g., an oxide semiconductor film) after baking.

These may be used alone, or in combination.

An amount of the organic solvent in the coating liquid for forming a metal oxide film is appropriately selected depending on the intended purpose without any limitation, but the amount thereof is preferably 50% by mass to 97% by mass, more preferably 80% by mass to 97% by mass. When the amount thereof is less than 50% by mass, a concentration of the inorganic metal compound in the coating liquid for forming a metal oxide film becomes excessively high, and therefore precipitation of the inorganic metal compound tends to cause at an edge of a nozzle due to evaporation of the solvent. In the case where a majority of balance is water that is a typical inorganic solvent, surface tension of a resulting coating liquid is high, i.e., 72 dyn/cm, and therefore ejectability of the coating liquid by inkjet is poor. As a boiling point of water is low, i.e., 100° C., a resulting coating liquid (ink) dries fast at an edge of a nozzle, which tends to cause clogging of the nozzle. When the amount of the organic solvent is greater than 97% by mass, a deposition amount of the inorganic metal compound after drying a resulting coating liquid is small, and therefore a number of coating applied to attain a necessary thickness of a metal oxide film increases, lowering productivity. When the amount of the organic solvent is in the aforementioned more preferable range, surface tension of a resulting coating liquid become small, which is advantageous in view of ejectability and drying properties.

A ratio of the raw materials of the metal oxide film (e.g., the indium compound, the magnesium compound, the calcium compound, the strontium compound, and the barium compound) to the organic solvent (e.g., the diol, and the glycol ether) in the coating liquid for forming a metal oxide film is appropriately selected depending on the intended purpose without any limitation, but it is preferred that a total of the raw material of the metal oxide film be 0.1 mol to 0.5 mol relative to 1 of the organic solvent. When the ratio thereof is less than 0.1 mol, a thickness of a metal oxide film formed after baking becomes excessively thin, and therefore it may be difficult to form a continuous film. Moreover, it is necessary to perform coating and drying repetitively to attain a necessary thickness of the metal oxide film. When the ratio thereof is greater than 0.5 mol, a frequency of occurrences of nozzle clogging at an edge of a inkjet nozzle may become high in the case where a resulting coating liquid is applied by inkjet printing.

In the coating liquid for forming a metal oxide film, the indium compound, at least one selected from the group consisting of the magnesium compound, the calcium compound, the strontium compound, and the barium compound, and at least one selected from the group consisting of the compound containing a metal a maximum positive value of an oxidation number of which is IV, the compound containing a metal a maximum positive value of an oxidation number of which is V, and the compound containing a metal a maximum positive value of an oxidation number of which is VI are preferably dissolved in the organic solvent.

<Production Method of Coating Liquid for Forming Metal Oxide Film>

A production method of the coating liquid for forming a metal oxide film is appropriately selected depending on the intended purpose without any limitation, and examples thereof include a method, in which a diol solution of a metal salt, and a glycol ether solution of a metal salt are separately prepared, followed by mixing these solutions at a predetermined ratio.

The coating liquid for forming a metal oxide film according to the present invention is suitable as a coating liquid used for producing a metal oxide film, and the coating liquid for forming a metal oxide film (coating liquid for forming an oxide semiconductor film) satisfying the formula (1), or the formula (2), or both thereof (preferably both formulae (1) and (2)) is especially suitable as a coating liquid used for producing an active layer of a field-effect transistor.

(Metal Oxide Film)

The metal oxide film of the present invention is obtained by applying the coating liquid for forming a metal oxide film of the present invention onto a base to be coated, and drying, followed by baking.

Examples of the metal oxide film include an oxide semiconductor film.

In the case where the coating liquid for forming a metal oxide film (coating liquid for forming an oxide semiconductor film), which satisfies the formula (1), or the formula (2), or both thereof (preferably satisfies both the formulae (1) and (2)) is used as the coating liquid for forming a metal oxide film, an oxide semiconductor film particularly suitable as an active layer of a field-effect transistor is attained.

The base to be coated is appropriately selected depending on the intended purpose without any limitation, and examples thereof include a glass base, and a plastic base.

In the case where the metal oxide film is used as an oxide semiconductor film for an active layer of a field-effect transistor, examples of the based to be coated include a base, and a gate insulating layer. A shape, structure, and size of the base are appropriately selected depending on the intended purpose without any limitation. A material of the base is appropriately selected depending on the intended purpose without any limitation, and examples thereof include a glass base, and a plastic base.

The application method is appropriately selected depending on the intended purpose without any limitation, and examples thereof include screen printing, roll coating, dip coating, spin coating, inkjet printing, and nanoimprinting. Among them, preferred are inkjet printing, and nanoimprinting, which can control a deposition amount of the coating liquid, as a desired shape of a metal oxide film, for example, in production of a field-effect transistor, a specified channel width in design (in other words, a desired shape of an active layer) can be attained. In the case where the coating liquid is applied by inkjet printing or nanoimprinting, coating is possible at room temperature, but a base (a base to be coated) is preferably heated to the range of about 40° C. to about 100° C., as wetting and spreading of the coating liquid are prevented just after deposited on a surface of the base.

The drying is appropriately selected depending on the intended purpose without any limitation, provided that it is preformed under the conditions with which volatile components in the coating liquid for forming a metal oxide film can be removed. Note that, it is not necessary to remove the volatile components completely during the drying, as long as the volatile components are removed to the degree at which baking is not adversely affected.

The baking temperature is appropriately selected depending on the intended purpose without any limitation, provided that it is equal to or higher the temperature at which indium, magnesium, calcium, strontium, barium, the metal whose maximum positive value of the oxidation number is IV, the metal whose maximum positive value of the oxidation number is V, and the metal whose maximum positive value of the oxidation number is VI form oxides, and is equal to or lower than the heat distortion temperature of the base (the base to be coated). The baking temperature is preferably 250° C. to 600° C.

The baking atmosphere is appropriately selected depending on the intended purpose without any limitation, and examples thereof include an atmosphere including oxygen, such as oxygen gas, and air. By using inert gas, such as nitrogen gas, for the baking atmosphere, an oxygen content in a resulting metal oxide film (e.g., an oxide semiconductor film) is reduced, and as a result, a metal oxide film (e.g., an oxide semiconductor film) having low resistance can be attained.

The electric properties, reliability, and uniformity of the metal oxide film (e.g., an oxide semiconductor film) can be further improved by performing annealing in air, an inert gas atmosphere, or a reducing gas atmosphere, after the baking.

The duration of the baking is appropriately selected depending on the intended purpose without any limitation.

The average thickness of the formed metal oxide film (e.g., an oxide semiconductor film) is appropriately selected depending on the intended purpose without any limitation, but the average thickness thereof is preferably 1 nm to 200 nm, more preferably 2 nm to 100 nm.

Use of the metal oxide film is appropriately selected depending on the intended purpose without any limitation. In the case where the volume resistivity of the metal oxide film is less than $10^{-2}$ Ωcm, for example, the metal oxide film can be used for a transparent electroconductive film. In the case where the volume resistivity of the metal oxide film is $10^{-2}$ Ωcm to $10^9$ Ωcm, for example, the metal oxide film can be used for an active layer of a field-effect transistor. In the case where the volume resistivity of the metal oxide film is greater than $10^9$ Ωcm, for example, the metal oxide film can be used for an antistatic film.

(Field-Effect Transistor)

The field-effect transistor of the present invention contains at least a gate electrode, a source electrode, a drain electrode, an active layer, and a gate insulating layer, and may further contain other members, according to the necessity.

The field-effect transistor of the present invention can be produced, for example, by the method for producing a field-effect transistor of the present invention.

<Gate Electrode>

The gate electrode is appropriately selected depending on the intended purpose without any limitation, provided that it is an electrode configured to apply gate voltage.

A material of the gate electrode is appropriately selected depending on the intended purpose without any limitation, and examples thereof include a metal (e.g., platinum, palladium, gold, silver, copper, zinc, aluminum, nickel, chromium, tantalum, molybdenum, and titanium), an alloy thereof, and a mixture of these metals. Further examples thereof include an electroconductive oxide (e.g., indium oxide, zinc oxide, tin oxide, gallium oxide, and niobium oxide), a composite compound thereof, and a mixture thereof.

The average thickness of the gate electrode is appropriately selected depending on the intended purpose without any limitation, but the average thickness thereof is preferably 40 nm to 2 μm, more preferably 70 nm to 1 μm.

<Gate Insulating Layer>

The gate insulating layer is appropriately selected depending on the intended purpose without any limitation, provided that it is an insulating layer formed between the gate electrode and the active layer.

A material of the gate insulating layer is appropriately selected depending on the intended purpose without any limitation, and examples thereof include an inorganic insulating material, and an organic insulating material.

Examples of the inorganic insulating material include silicon oxide, aluminum oxide, tantalum oxide, titanium oxide, yttrium oxide, lanthanum oxide, hafnium oxide, zirconium oxide, silicon nitride, aluminum nitride, and a mixture thereof.

Examples of the organic insulating material include polyimide, polyamide, polyacrylate, polyvinyl alcohol, and a novolak resin.

The average thickness of the gate insulating layer is appropriately selected depending on the intended purpose without any limitation, but the average thickness thereof is preferably 50 nm to 3 μm, more preferably 100 nm to 1 μm.

<Source Electrode and Drain Electrode>

The source electrode and the drain electrode are appropriately selected depending on the intended purpose without any limitation, provided that they are electrodes configured to extract electric current.

A material of the source electrode and the drain electrode is appropriately selected depending on the intended purpose without any limitation, and examples thereof include the same materials to those listed in the descriptions of the gate electrode.

The average thickness of the source electrode and the drain electrode is appropriately selected depending on the intended purpose without any limitation, but the average thickness thereof is preferably 40 nm to 2 μm, more preferably 70 nm to 1 μm.

<Active Layer>

The active layer is an active layer composed of an oxide semiconductor, which is formed between the source electrode and the drain electrode, and is an oxide semiconductor formed by applying the coating liquid for forming a metal oxide film of the present invention.

The average thickness of the active layer is appropriately selected depending on the intended purpose without any limitation, but the average thickness thereof is preferably 1 nm to 200 nm, more preferably 5 nm to 100 nm.

Figure 2:
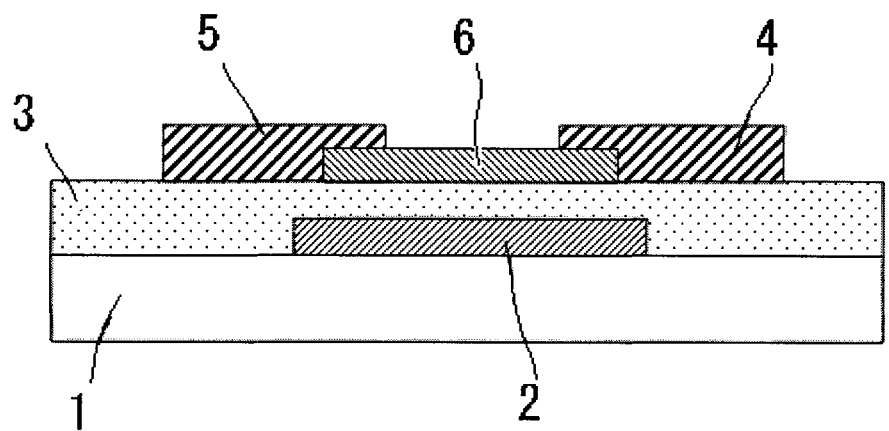
FIG. 2 is a schematic structure diagram illustrating one example of a bottom gate/top contact field-effect transistor.
Figure 3:
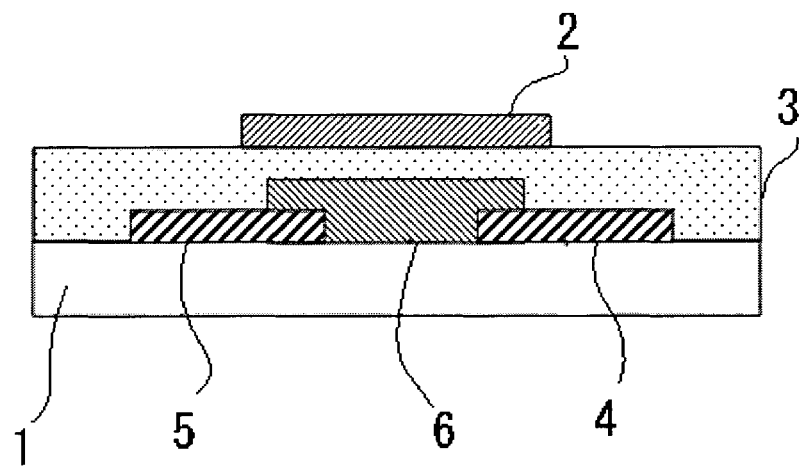
FIG. 3 is a schematic structure diagram illustrating one example of a top gate/bottom contact field-effect transistor.
Figure 4:
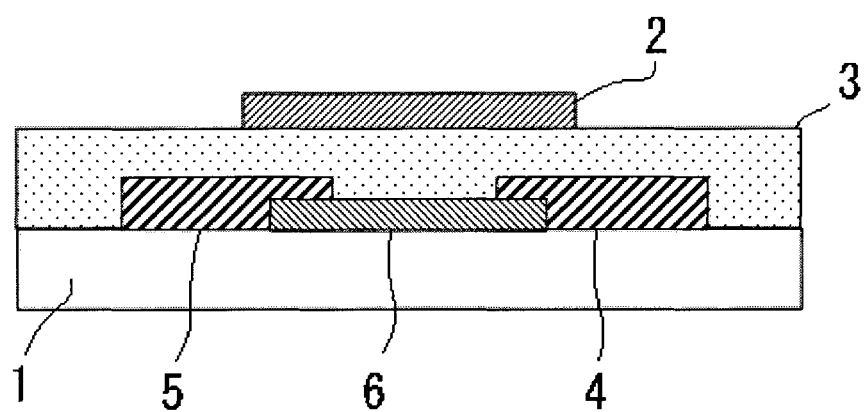
FIG. 4 is a schematic structure diagram illustrating one example of a top gate/top contact field-effect transistor.

A structure of the field-effect transistor is appropriately selected depending on the intended purpose without any limitation, and examples thereof include a bottom gate/bottom contact type (FIG. 1), a bottom gate/top contact type (FIG. 2), a top gate/bottom contact type (FIG. 3), and a top gate/top contact type (FIG. 4).

Note that, in FIGS. 1 to 4, 1 is a base, 2 is a gate electrode, 3 is a gate insulating layer, 4 is a source electrode, 5 is a drain electrode, and 6 is an active layer.

The field-effect transistor of the present invention is suitably used as a field-effect transistor for a picture element driving circuit of a liquid crystal display, an organic EL display, or an electrochromic display, and a logic circuit.

(Method for Producing Field-Effect Transistor)

The method for producing a field-effect transistor of the present invention (first production method) contains: forming a gate electrode on a base (gate electrode forming step); forming a gate insulating layer on the gate electrode (gate insulating layer forming step); forming a source electrode and a drain electrode on the gate insulating layer with a space between the source electrode and the drain electrode (source electrode and drain electrode forming step); and forming an active layer formed of oxide semiconductor on an area of the gate insulating layer, which is a channel region between the source electrode and the drain electrode (an active layer forming step).

Moreover, the method for producing a field-effect transistor of the present invention (second production method) contains: forming a source electrode and a drain electrode on a base with a space between the source electrode and the drain electrode (a source electrode and drain electrode forming step); forming an active layer formed of oxide semiconductor on an area of the base, which is a channel region between the source electrode and the drain electrode (an active layer forming step); and forming a gate insulating layer on the active layer (a gate insulating layer forming step); and forming a gate electrode on the gate insulating layer (a gate electrode forming step).

<First Production Method>

The first production method is explained as follows.

—Base—

A shape, structure, and size of the base are appropriately selected depending on the intended purpose without any limitation.

The base is appropriately selected depending on the intended purpose without any limitation, and examples thereof include a glass base, and a plastic base.

A material of the glass base is appropriately selected depending on the intended purpose without any limitation, and examples thereof include non-alkali glass, and silica glass.

A material of the plastic base is appropriately selected depending on the intended purpose without any limitation, and examples thereof include polycarbonate (PC), polyimide (PI), polyethylene terephthalate (PET), and polyethylene naphthalate (PEN).

Note that, the base is preferably subjected to a pretreatment, such as oxygen plasma, UV ozone, and UV radiation washing.

—Gate Electrode Forming Step—

The gate electrode forming step is appropriately selected depending on the intended purpose without any limitation, provided that is contains forming a gate electrode on the base. Examples thereof include (i) a step containing forming a film through sputtering or dip coating, followed by patterning through photolithography, and (ii) a step containing directly form a desired shape of a film through a printing process, such as inkjet printing, nanoimprinting, and gravure printing.

—Gate Insulating Layer Forming Step—

The gate insulating layer forming step is appropriately selected depending on the intended purpose without any limitation, provided that it contains forming a gate insulating layer on the gate electrode. Examples thereof include (i) a step containing forming a film through sputtering or dip coating, followed by patterning through photolithography, and (ii) a step containing directly form a desired shape of a film through a printing process, such as inkjet printing, nanoimprinting, and gravure printing.

—Source Electrode and Drain Electrode Forming Step—

The source electrode and drain electrode forming step is appropriately selected depending on the intended purpose without any limitation, provided that it contains forming a source electrode and a drain electrode on the gate insulating layer with a space between the source electrode and the drain electrode. Examples thereof include (i) a step containing forming a film through sputtering or dip coating, followed by patterning through photolithography, and (ii) a step containing directly form a desired shape of a film through a printing process, such as inkjet printing, nanoimprinting, and gravure printing.

—Active Layer Forming Step—

The active layer forming step is appropriately selected depending on the intended purpose without any limitation, provided that it contains applying the coating liquid for forming a metal oxide film of the present invention on an area of the gate insulating layer, which is a channel region between the source electrode and the drain electrode, to thereby form an active layer formed of oxide semiconductor.

In the active layer forming step, it is preferred that at least one selected from the group consisting of the volume resistivity, carrier mobility, carrier density of the oxide semiconductor be controlled by adjusting the number (A) of indium atoms of the indium compound, the total (B) of a number of magnesium atoms in the magnesium compound, a number of calcium atoms of the calcium compound, a number of strontium atoms of the strontium compound, and a number of barium atoms of the barium compound, and the total (C) of a number of metal atoms of the compound containing a metal a maximum positive value of an oxidation number of which is IV, the compound containing a metal a maximum positive value of an oxidation number of which is V, and the compound containing a metal a maximum positive value of an oxidation number of which is VI. By doing so, a field-effect transistor of desired properties (e.g., an on/off ratio) can be attained.

In the active layer forming step, it is preferred that the coating liquid for forming a metal oxide film contain the glycol ether and the diol, and a viscosity of the coating liquid for forming a metal oxide film be controlled by adjusting a blending ratio of the glycol ether and the diol in the coating liquid for forming a metal oxide film. By doing so, a field-effect transistor having excellent coating proptery, and an excellent channel formation state can be attained.

A method for applying the coating liquid for forming a metal oxide film to form oxide semiconductor is appropriately selected depending on the intended purpose without any limitation, and examples thereof include a method containing applying the coating liquid for forming a metal oxide film on the base to which the gate insulating layer has been formed, and drying, followed by baking.

The coating method is appropriately selected depending on the intended purpose without any limitation, and examples thereof include screen printing, roll coating, dip coating, spin coating, inkjet printing, and nanoimprinting. Among them, inkjet printing and nanoimprinting, with which a deposition amount of the coating liquid can be controlled, are preferable, because a specified channel width in the design (in other words, a desired shape of an active layer) can be attained in the production of a field-effect transistor.

The drying is appropriately selected depending on the intended purpose without any limitation, provided that it is performed under the conditions with which volatile components in the coating liquid for forming a metal oxide film can be removed. Note that, it is not necessary to completely remove the volatile components during the drying, as long as the volatile components can be removed to the degree with which baking is not adversely affected.

The baking temperature is appropriately selected depending on the intended purpose without any limitation, but it is preferably 250° C. to 600° C.

In the first production method, an order for carrying out the source electrode and drain electrode forming step, and the active layer forming step is not limited. The active layer forming step may be carried out after the source electrode and drain electrode forming step. The source electrode and drain electrode forming step may be carried out after the active layer forming step.

When the active layer forming step is carried out after the source electrode and drain electrode forming step in the first production method, a bottom gate/bottom contact-type field-effect transistor can be produced.

When the source electrode and drain electrode forming step is carried out after the active layer forming step in the first production method, a bottom gate/top contact-type field-effect transistor can be produced.

A production method of a bottom gate/bottom contact-type field-effect transistor is explained with reference to FIGS. 5A to 5D.

Figure 5A:
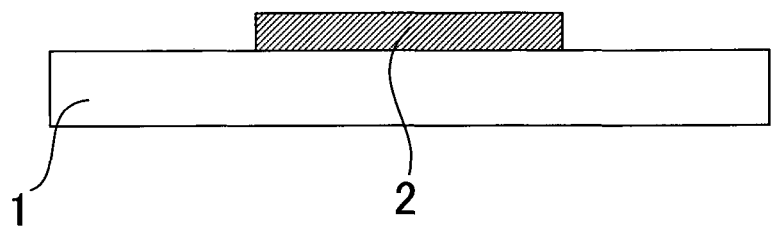
FIG. 5A is a diagram illustrating one example of the method for forming a field-effect transistor according to the present invention (part 1).

First, an electroconductive film formed of aluminum is formed on a base 1, such as a glass substrate, by sputtering, and the formed electroconductive film is patterned by etching to thereby form a gate electrode 2 (FIG. 5A).

Figure 5B:
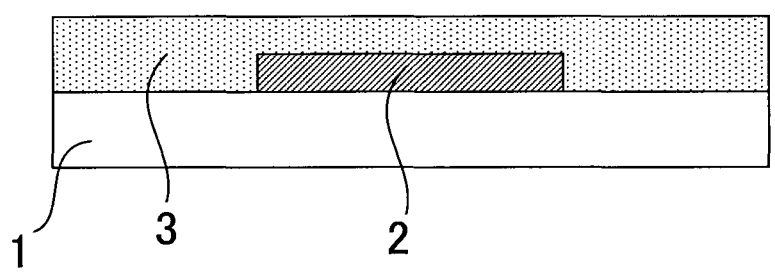
FIG. 5B is a diagram illustrating one example of the method for forming a field-effect transistor according to the present invention (part 2).

Subsequently, a gate insulating layer 3 formed of $SiO_2$ is formed on the gate electrode 2 and the base 1 by sputtering to over the gate electrode 2 (FIG. 5B).

Figure 5C:
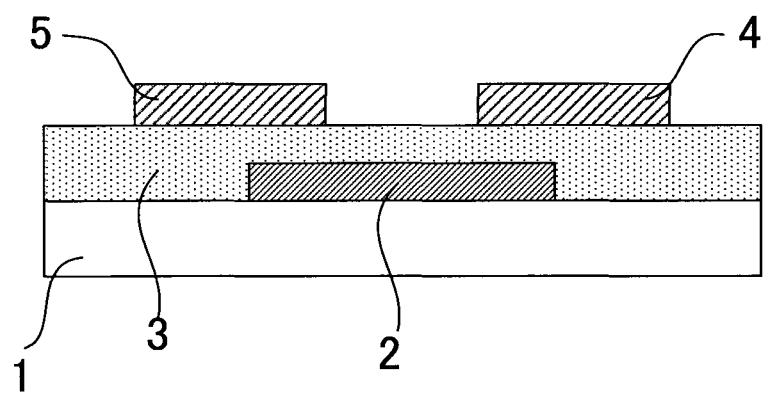
FIG. 5C is a diagram illustrating one example of the method for forming a field-effect transistor according to the present invention (part 3).

Next, an electroconductive film formed of ITO is formed on the gate insulating layer 3 by sputtering, and the formed electroconductive film is patterned by etching to thereby form a source electrode 4 and a drain electrode 5 (FIG. 5C).

Figure 5D:
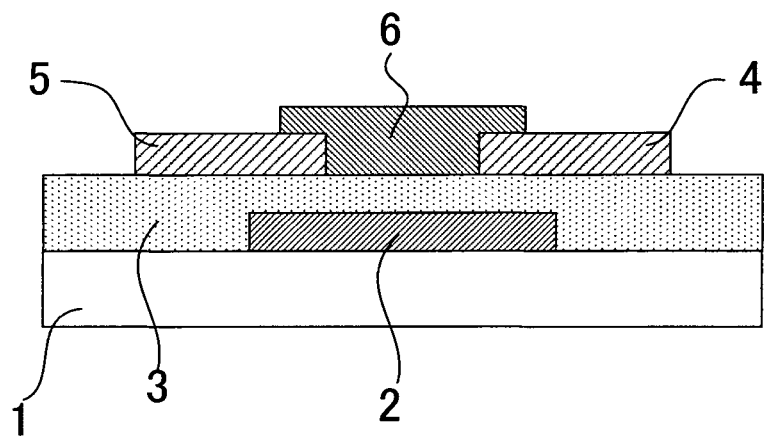
FIG. 5D is a diagram illustrating one example of the method for forming a field-effect transistor according to the present invention (part 4).

Subsequently, the coating liquid for forming a metal oxide film is applied on the gate insulating layer 3 by inkjet printing to over a channel region formed between the source electrode 4 and the drain electrode 5, followed by performing a heat treatment to thereby form an active layer 6 formed of oxide semiconductor (FIG. 5D).

In the manner as described above, a field-effect transistor is produced.

<Second Production Method>

The second production method is explained.

—Base—

The base is appropriately selected depending on the intended purpose without any limitation, and examples thereof include those listed as the base in the first production method.

—Source Electrode and Drain Electrode Forming Step—

The source electrode and drain electrode forming step is appropriately selected depending on the intended purpose without any limitation, provided that it contains forming a source electrode and a drain electrode on the base with a space between the source electrode and the drain electrode. Examples thereof include the steps listed in the descriptions of the source electrode and drain electrode forming step of the first production method.

—Active Layer Forming Step—

The active layer forming step is appropriately selected depending on the intended purpose without any limitation, provided that it contains applying the coating liquid for forming a metal oxide film of the present invention an area of the base, which is a channel region between the source electrode and the drain electrode, to thereby form an active layer formed of oxide semiconductor.

A method for applying the coating liquid for forming a metal oxide film to form the oxide semiconductor is appropriately selected depending on the intended purpose without any limitation, and examples thereof include the methods listed in the descriptions of the active layer forming step of the first production method.

In the active layer forming step, it is preferred that at least one selected from the group consisting of the volume resistivity, carrier mobility, carrier density of the oxide semiconductor be controlled by adjusting the number (A) of indium atoms of the indium compound, the total (B) of a number of magnesium atoms in the magnesium compound, a number of calcium atoms of the calcium compound, a number of strontium atoms of the strontium compound, and a number of barium atoms of the barium compound, and the total number (C) of metal atoms of the compound containing a metal a maximum positive value of an oxidation number of which is IV, the compound containing a metal a maximum positive value of an oxidation number of which is V, and the compound containing a metal a maximum positive value of an oxidation number of which is VI. By doing so, a field-effect transistor of desired properties (e.g., an on/off ratio) can be attained. Especially, the compound containing a metal a maximum positive value of an oxidation number of which is IV, the compound containing a metal a maximum positive value of an oxidation number of which is V, and the compound containing a metal a maximum positive value of an oxidation number of which is VI generate carrier efficiently inside the active layer, and therefore the process temperature can be set low.

In the active layer forming step, it is preferred that the coating liquid for forming a metal oxide film contain the glycol ether and the diol, and a viscosity of the coating liquid for forming a metal oxide film be controlled by adjusting a blending ratio of the glycol ether and the diol in the coating liquid for forming a metal oxide film. By doing so, a field-effect transistor having excellent coating proptery, and an excellent channel formation state can be attained.

—Gate Insulating Layer Forming Step—

The gate insulating layer forming step is appropriately selected depending on the intended purpose without any limitation, provided that it contains forming a gate insulating layer on the active layer. Examples thereof include the steps listed in the descriptions of the gate insulating layer forming step of the first production method.

—Gate Electrode Forming Step—

The gate electrode forming step is appropriately selected depending on the intended purpose without any limitation, provided that it contains forming a gate electrode on the gate insulating layer. Examples thereof include the steps listed in the descriptions of the gate electrode forming step of the first production method.

In the second production method, an order for carrying out the source electrode and drain electrode forming step and the active layer forming step is not limited. The active layer forming step may be carried out after the source electrode and drain electrode forming step. The source electrode and drain electrode forming step may be carried out after the active layer forming step.

When the active layer forming step is carried out after the source electrode and drain electrode forming step in the second production method, a top gate/bottom contact-type field-effect transistor can be produced.

When the source electrode and drain electrode forming step is carried out after the active layer forming step in the second production method, a top gate/top contact-type field-effect transistor can be produced.

EXAMPLES

Examples of the present invention are explained hereinafter, but Examples shall not be construed as to limit the scope of the present invention in any way.

Example 1

Preparation of Coating Liquid for Forming Metal Oxide Film

In a beaker, 3.55 g of indium nitrate ($In(NO_3)_3 \cdot 3H_2O$), 0.256 g of magnesium nitrate ($Mg(NO_3)_2 \cdot 6H_2O$), and 0.019 g of tin chloride ($SnCl_2$) were weighted. To his, 20 mL of 1,2-propanediol, and 20 mL of ethylene glycol monomethyl ether were added, and the resultant was mixed at room temperature to dissolve, to thereby prepare a coating liquid for forming a metal oxide film.

[B/A](A represents a number of indium atoms, and B represents a sum of a number of magnesium atoms, a number of calcium atoms, a number of strontium atoms, and a number of barium atoms), [C/A](A represents a number of indium atoms, and C represents a sum of numbers of the D metal atoms), and an amount of the glycol ether (% by mass) in the obtained coating liquid for forming a metal oxide film, and a ratio of the raw material to 1 of the diol and the glycol ether are depicted in Table 2.

<Production of Field-Effect Transistor>

—Formation of Gate Electrode—

A molybdenum film was formed on a glass substrate by DC sputtering so that the average thickness of the molybdenum film was to be about 100 nm. Thereafter, a photoresist was applied thereon, and the applied photoresist was subjected to prebaking, exposure by an exposure device, and developing, to thereby form a resist pattern having the same pattern to a pattern of a gate electrode to be formed. Further, etching was performed using an etching solution containing phosphoric acid, nitric acid, and acetic acid, to remove the area of the molybdenum film to which the resist pattern had not been formed. Thereafter, the remaining resist pattern was removed, to thereby form a gate electrode.

—Formation of Gate Insulating Layer—

A $SiO_2$ film was formed on the formed gate electrode and the glass substrate by RF sputtering so that the average thickness of the $SiO_2$ film was to be about 200 nm. Thereafter, a photoresist was applied thereon, and the applied photoresist was subjected to prebaking, exposure by an exposure device, and developing, to thereby form a resist pattern having the same pattern to a pattern of a gate insulating layer to be formed. Further, etching was performed using an etching using buffered hydrofluoric acid, to thereby remove the region of the $SiO_2$ film to which the resist pattern had not been formed. Thereafter, the remaining resist pattern was removed, to thereby form a gate insulating layer.

—Formation of Source Electrode and Drain Electrode—

An ITO film ($In_2O_3$—$SnO_2$ (5% by mass)), which was a transparent electroconductive film was formed on the formed gate insulating layer by DC sputtering so that the average thickness of the ITO film was to be about 100 nm. Thereafter, a photoresist was applied onto the ITO film, and the applied photoresist was subjected to prebaking, exposure by an exposure device, and developing, to thereby form a resist pattern having the same pattern to a pattern of a source electrode and drain electrode to be formed. Further, etching was performed using an oxalic acid-based etching solution, to thereby remove the region of the ITO film to which the resist pattern had not been formed. Thereafter, the remaining resist pattern was removed, to thereby form a source electrode and drain electrode each formed of the ITO film. The channel width defined with the width of the source electrode was 30 μm, and the channel length defined with the length between the source electrode and the drain electrode was 10 μm.

—Formation of Active Layer—

The coating liquid for forming a metal oxide film was applied to the channel between the formed source electrode and drain electrode by means of an inkjet device.

The applied coating liquid was dried for 10 minutes on a hot plate a substrate of which was heated to 120° C., followed by baking for 1 hour in the air 300° C. The resultant was further subjected to annealing for 1 hour in the air of 300° C., to thereby obtain an active layer. The average thickness of the channel part of the active layer was about 10 nm.

In the manner as described, a field-effect transistor was produced.

<Evaluation>

—Channel Formation State (Coating Property)—

In the formation of the field-effect transistor, spreading of the coating liquid for forming a metal oxide film, when the coating liquid was applied by the inkjet device, was observed under an optical microscope, and the channel formation state was evaluated based on the following evaluation criteria. The results are presented in Table 3.

Figure 6:
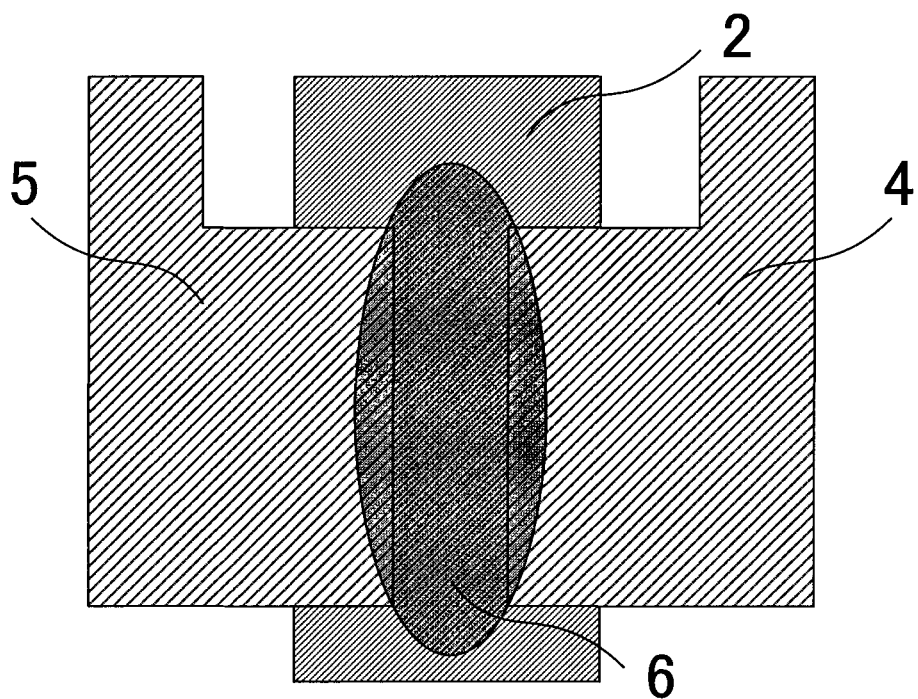
FIG. 6 is a schematic diagram illustrating a state where the coatability of the coating liquid for forming a metal oxide film is excellent.

A: The active layer was spread between the source electrode and the drain electrode, and did not reach over the gate electrode (see FIG. 6).

Figure 7:
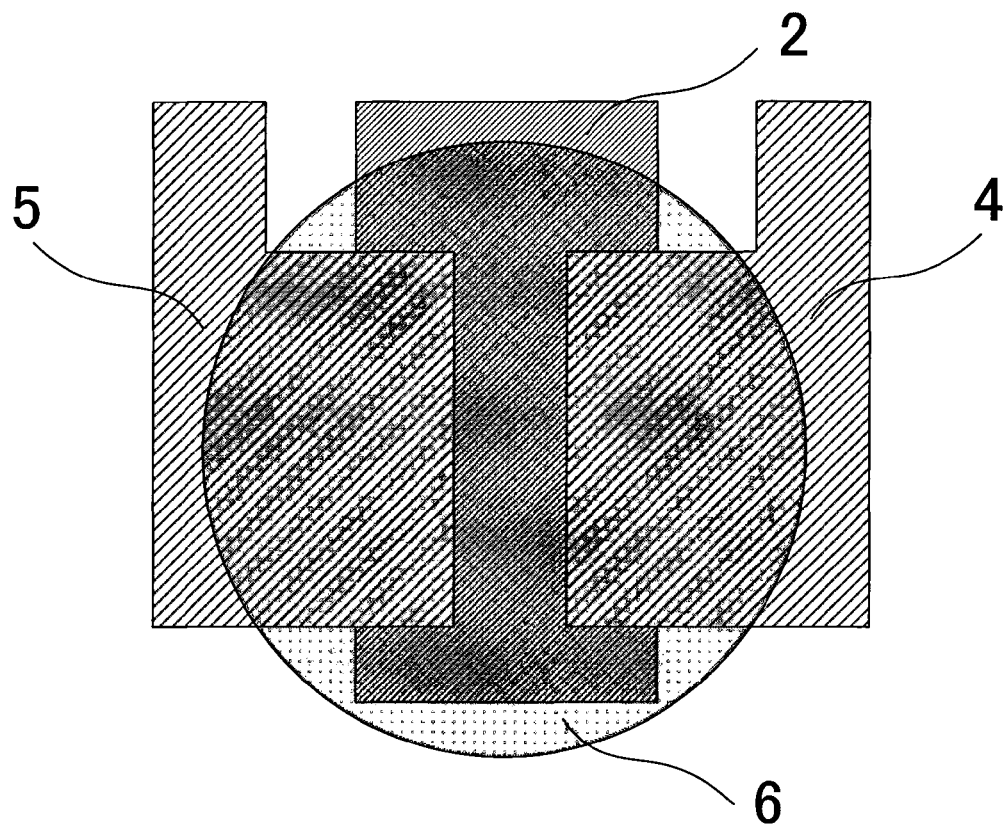
FIG. 7 is a schematic diagram illustrating a state where the coatability of the coating liquid for forming a metal oxide film is undesirable.

B: The active layer was spread beyond the space between the source electrode and the drain electrode, and reached over the gate electrode (see FIG. 7).

—Volume Resistivity—

An electric current when voltage of 0 V±20 V was applied between the source electrode and drain electrode of the obtained field-effect transistor was applied was measured by means of a semiconductor parameter analyzer (Semiconductor Parameter Analyzer 4156C, manufactured by Agilent Technologies, Inc.) in accordance with a two-terminal method, to thereby measure volume resistivity of the active layer. The results are presented in Table 3.

—Carrier Mobility and on/Off Ratio—

Figure 8:
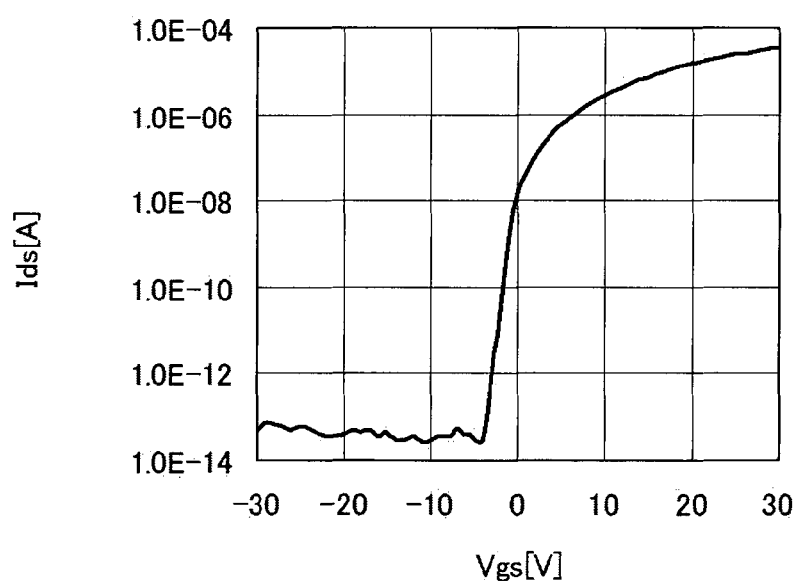
FIG. 8 is a graph depicting a relationship between the gate electrode Vgs and the current Ids between the source and drain in the field-effect transistor produced in Example 1.

A relationship between the gate voltage Vgs and current between the source electrode and drain electrode Ids of the obtained field-effect transistor was determined by means of a semiconductor parameter analyzer (Semiconductor Parameter Analyzer 4156C, manufactured by Agilent Technologies, Inc.), when the voltage between the source electrode and drain electrode Vds was set to 20 V. The results are depicted in the graph of FIG. 8. It could be confirmed from FIG. 8 that excellent transistor properties were attained. Note that, in FIG. 8, "E" represents "exponent of 10." For example, "E-04" is "0.0001."

The carrier mobility was calculated in the saturation region. Moreover, the on/off ratio was determined. Note that, in the on/off ratio, the on-state value was a value of Ids at 30 V. The results are presented in Table 3.

Examples 2 to 36 and Comparative Examples 2 to 5

Preparation of Coating Liquid for Forming Metal Oxide Film

Coating liquids for forming a metal oxide film of Examples 2 to 36 and Comparative Examples 2 to 5 were each prepared in the same manner as in Example 1, provided that the formulation of the coating liquid was changed as depicted in Table 1.

[B/A], [C/A], and an amount of the glycol ether (% by mass) in the obtained coating liquid for forming a metal oxide film, and a ratio of the raw materials relative to 1 of the diol and glycol ether are presented in Table 2.

Comparative Example 1

Preparation of Coating Liquid for Forming Metal Oxide Film

In order to evaluate the solvent composition disclosed in JP-A No. 2009-177149, 3.55 g of indium nitrate, and 1.26 g of magnesium nitrate were added to 40 mL of water and 40 mL of ethanol and a resultant was mixed to dissolve, to thereby prepare a coating liquid for forming a metal oxide film.

<Production of Evaluation of Field-Effect Transistor>

A field-effect transistor was produced using each of the coating liquids for forming a metal oxide film of Examples 2 to 36 and Comparative Examples 2 to 5 in the same manner as in Example 1, and was evaluated in the same manner as in Example 1. The results are presented in Table 3.

Note that, the coating liquid for forming a metal oxide film of Comparative Example 1 had poor coating property. Therefore, an active layer, with which transistor properties could be evaluated, could not be formed.

TABLE 1

| | | Raw material A | | Raw material B | | Raw material C | | Diol | | Glycol ether | |
|---|---|---|---|---|---|---|---|---|---|---|---|
| | | Type | (g) | Type | (g) | Type | (g) | Type | (mL) | Type | (mL) |
| Example | 1 | indium nitrate | 3.55 | magnesium nitrate | 0.256 | tin chloride | 0.019 | 1,2-propane diol | 20 | ethylene glycol monomethyl ether | 20 |
| | 2 | | 3.55 | | 0.256 | germanium chloride | 0.021 | | 20 | | 20 |
| | 3 | | 3.55 | | 0.256 | zirconium oxychloride | 0.032 | | 20 | | 20 |
| | 4 | | 3.55 | | 0.256 | hafnium oxychloride | 0.041 | | 20 | | 20 |
| | 5 | | 3.55 | | 0.256 | antimony chloride | 0.023 | | 20 | | 20 |
| | 6 | | 3.55 | | 0.256 | molybdenum oxide acetylacetonate | 0.033 | | 20 | | 20 |
| | 7 | | 3.55 | | 0.256 | tungsten chloride | 0.04 | | 20 | | 20 |
| | 8 | | 3.55 | strontium chloride | 0.267 | tin chloride | 0.019 | | 20 | | 20 |
| | 9 | | 3.55 | | 0.090 | | 0.019 | | 20 | | 20 |
| | 10 | | 3.55 | | 0.114 | | 0.019 | | 20 | | 20 |
| | 11 | | 3.55 | | 1.280 | | 0.019 | | 20 | | 20 |
| | 12 | | 3.55 | | 1.387 | | 0.019 | | 20 | | 20 |
| | 13 | | 3.55 | | 0.267 | | 0.00016 | | 20 | | 20 |
| | 14 | | 3.55 | | 0.267 | | 0.00022 | | 20 | | 20 |
| | 15 | | 3.55 | | 0.267 | | 0.182 | | 20 | | 20 |
| | 16 | | 3.55 | | 0.267 | | 0.205 | | 20 | | 20 |
| | 17 | | 3.55 | | 0.267 | germanium chloride | 0.021 | | 20 | | 20 |
| | 18 | | 3.55 | | 0.267 | zirconium oxychloride | 0.032 | | 20 | | 20 |
| | 19 | | 3.55 | | 0.267 | hafnium oxychloride | 0.041 | | 20 | | 20 |
| | 20 | | 3.55 | | 0.267 | antimony chloride | 0.023 | | 20 | | 20 |
| | 21 | | 3.55 | | 0.267 | molybdenum oxide acetylacetonate | 0.033 | | 20 | | 20 |
| | 22 | | 3.55 | | 0.267 | tungsten chloride | 0.04 | | 20 | | 20 |
| | 23 | | 3.55 | calcium nitrate | 0.236 | tin chloride | 0.019 | | 20 | | 20 |
| | 24 | | 3.55 | | 0.236 | germanium chloride | 0.021 | | 20 | | 20 |
| | 25 | | 3.55 | | 0.236 | zirconium oxychloride | 0.032 | | 20 | | 20 |
| | 26 | | 3.55 | | 0.236 | titanium compound | 0.091 | | 20 | | 20 |
| | 27 | | 3.55 | | 0.236 | antimony chloride | 0.023 | | 20 | | 20 |
| | 28 | | 3.55 | | 0.236 | molybdenum oxide acetylacetonate | 0.033 | | 20 | | 20 |
| | 29 | | 3.55 | | 0.236 | tungsten chloride | 0.04 | | 20 | | 20 |
| | 30 | | 3.55 | barium compound | 0.850 | tin chloride | 0.019 | | 20 | | 20 |
| | 31 | | 3.55 | | 0.850 | germanium chloride | 0.021 | | 20 | | 20 |
| | 32 | | 3.55 | | 0.850 | zirconium oxychloride | 0.032 | | 20 | | 20 |
| | 33 | | 3.55 | | 0.850 | hafnium oxychloride | 0.041 | | 20 | | 20 |
| | 34 | | 3.55 | | 0.850 | antimony chloride | 0.023 | | 20 | | 20 |
| | 35 | | 3.55 | | 0.850 | molybdenum oxide acetylacetonate | 0.033 | | 20 | | 20 |
| | 36 | | 3.55 | | 0.850 | tungsten chloride | 0.04 | | 20 | | 20 |
| Comparative Ex. | 1 | | 3.55 | magnesium nitrate | 1.281 | — | — | | * | | |
| | 2 | | 3.55 | | 0.256 | — | — | 1,2-propane diol | 20 | ethylene glycol monomethyl ether | 20 |
| | 3 | | 3.55 | calcium nitrate | 0.236 | — | — | | 20 | | 20 |
| | 4 | | 3.55 | strontium chloride | 0.267 | — | — | | 20 | | 20 |
| | 5 | | 3.55 | barium compound | 0.850 | — | — | | 20 | | 20 |

In Table 1, indium nitrate represents $In(NO_3)_3 \cdot 3H_2O$, magnesium nitrate represents $Mg(NO_3)_2 \cdot 6H_2O$, strontium chloride represents $SrCl_2 \cdot 6H_2O$, calcium nitrate represents $Ca(NO_3)_2 \cdot 4H_2O$, tin chloride represents $SnCl_2$, germanium chloride represents GeCl$_4$, zirconium oxychloride represents ZnCl$_2$O.8H$_2$O, hafnium oxychloride represents HfCl$_2$O.8H$_2$O, antimony chloride represents SbCl$_3$, molybdenum oxide acetylacetonate represents molybdenum (VI) oxide bis(acetylacetonate), and tungsten chloride represents WCl$_6$.

In Table 1, (*1) denotes 40 mL of water and 40 mL of ethanol.

In Table 1, the barium compound is barium bistetrahydrofuryloxide (represented by the following structural formula). A blended amount of the barium bistetrahydrofuryloxide is a blended amount of a barium bistetrahydrofuryloxide solution (a solution containing 40% by mass of barium bistetrahydrofuryloxide, 36% by mass of ethyl alcohol, and 24% by mass of tetrahydrofuryl alcohol) manufactured by Sigma-Aldrich Inc.

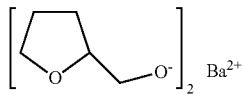

In Table 1, the titanium compound is titanium tetrahydrofuryl oxide (represented by the following structural formula). The blended amount of the titanium tetrahydrofuryl oxide is an amount of a titanium tetrahydrofuryl oxide solution (50% by mass of titanium tetrahydrofuryl oxide, and 50% by mass of a mixed solvent containing isopropyl alcohol and tetrahydrofuran) manufactured by AZmax Co.

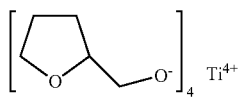

TABLE 2

|  |  | B/A | C/A | Amount of glycol ether (mass %) | Ratio of metal salt to 1 L of diol and glycol ether (mol) |
|---|---|---|---|---|---|
| Ex. | 1 | 0.100 | 0.010 | 44.0% | 0.278 |
|  | 2 | 0.100 | 0.010 | 44.0% | 0.278 |
|  | 3 | 0.100 | 0.010 | 44.0% | 0.278 |
|  | 4 | 0.100 | 0.010 | 44.0% | 0.278 |
|  | 5 | 0.100 | 0.010 | 44.0% | 0.278 |
|  | 6 | 0.100 | 0.010 | 44.0% | 0.278 |
|  | 7 | 0.100 | 0.010 | 44.0% | 0.278 |
|  | 8 | 0.100 | 0.010 | 44.0% | 0.278 |
|  | 9 | 0.034 | 0.010 | 44.2% | 0.261 |
|  | 10 | 0.043 | 0.010 | 44.2% | 0.263 |
|  | 11 | 0.480 | 0.010 | 43.0% | 0.373 |
|  | 12 | 0.520 | 0.010 | 42.9% | 0.383 |
|  | 13 | 0.100 | 0.00008 | 44.0% | 0.275 |
|  | 14 | 0.100 | 0.00012 | 44.0% | 0.275 |
|  | 15 | 0.100 | 0.096 | 43.8% | 0.299 |
|  | 16 | 0.100 | 0.108 | 43.8% | 0.302 |
|  | 17 | 0.100 | 0.010 | 44.0% | 0.278 |
|  | 18 | 0.100 | 0.010 | 44.0% | 0.278 |
|  | 19 | 0.100 | 0.010 | 44.0% | 0.278 |
|  | 20 | 0.100 | 0.010 | 44.0% | 0.278 |
|  | 21 | 0.100 | 0.010 | 44.0% | 0.278 |
|  | 22 | 0.100 | 0.010 | 44.0% | 0.278 |
|  | 23 | 0.100 | 0.010 | 44.0% | 0.278 |
|  | 24 | 0.100 | 0.010 | 44.0% | 0.278 |
|  | 25 | 0.100 | 0.010 | 44.0% | 0.278 |
|  | 26 | 0.100 | 0.010 | 44.0% | 0.278 |
|  | 27 | 0.100 | 0.010 | 44.0% | 0.278 |

TABLE 2-continued

|  |  | B/A | C/A | Amount of glycol ether (mass %) | Ratio of metal salt to 1 L of diol and glycol ether (mol) |
|---|---|---|---|---|---|
|  | 28 | 0.100 | 0.010 | 44.0% | 0.278 |
|  | 29 | 0.100 | 0.010 | 44.0% | 0.278 |
|  | 30 | 0.100 | 0.010 | 43.4% | 0.278 |
|  | 31 | 0.100 | 0.010 | 43.4% | 0.278 |
|  | 32 | 0.100 | 0.010 | 43.4% | 0.278 |
|  | 33 | 0.100 | 0.010 | 43.4% | 0.278 |
|  | 34 | 0.100 | 0.010 | 43.4% | 0.278 |
|  | 35 | 0.100 | 0.010 | 43.4% | 0.278 |
|  | 36 | 0.100 | 0.010 | 43.4% | 0.278 |
| Comp. Ex. | 1 | 0.500 | 0.000 | 0.0% | — |
|  | 2 | 0.100 | 0.000 | 44.0% | 0.275 |
|  | 3 | 0.100 | 0.000 | 44.1% | 0.275 |
|  | 4 | 0.100 | 0.000 | 44.0% | 0.275 |
|  | 5 | 0.100 | 0.000 | 43.4% | 0.275 |

TABLE 3

|  |  | Channel formation state | Volume resistivity ($\Omega$cm) | Carrier mobility (cm$^2$/Vs) | On/off ratio |
|---|---|---|---|---|---|
| Ex. | 1 | A | $1 \times 10^2$ | 2.2 | $1.2 \times 10^8$ |
|  | 2 | A | $8 \times 10^1$ | 1.9 | $1.3 \times 10^8$ |
|  | 3 | A | $9 \times 10^1$ | 1.8 | $8.8 \times 10^7$ |
|  | 4 | A | $8 \times 10^1$ | 2.1 | $1.6 \times 10^8$ |
|  | 5 | A | $7 \times 10^1$ | 2.0 | $2.0 \times 10^8$ |
|  | 6 | A | $5 \times 10^1$ | 1.8 | $8.5 \times 10^7$ |
|  | 7 | A | $6 \times 10^1$ | 1.9 | $9.5 \times 10^7$ |
|  | 8 | A | $5 \times 10^1$ | 2.0 | $1.1 \times 10^8$ |
|  | 9 | A | $7 \times 10^0$ | 1.6 | $7.1 \times 10^7$ |
|  | 10 | A | $8 \times 10^0$ | 2.2 | $1.0 \times 10^8$ |
|  | 11 | A | $2 \times 10^2$ | 1.6 | $7.7 \times 10^7$ |
|  | 12 | A | $4 \times 10^2$ | 1.0 | $2.5 \times 10^7$ |
|  | 13 | A | $2 \times 10^2$ | 1.1 | $4.2 \times 10^7$ |
|  | 14 | A | $7 \times 10^1$ | 2.5 | $2.6 \times 10^8$ |
|  | 15 | A | $4 \times 10^0$ | 2.2 | $1.3 \times 10^8$ |
|  | 16 | A | $1 \times 10^0$ | 1.0 | $2.8 \times 10^7$ |
|  | 17 | A | $2 \times 10^2$ | 1.9 | $1.0 \times 10^8$ |
|  | 18 | A | $8 \times 10^1$ | 2.0 | $1.5 \times 10^8$ |
|  | 19 | A | $7 \times 10^1$ | 2.3 | $2.5 \times 10^8$ |
|  | 20 | A | $5 \times 10^1$ | 2.2 | $1.4 \times 10^8$ |
|  | 21 | A | $6 \times 10^1$ | 2.1 | $1.9 \times 10^8$ |
|  | 22 | A | $4 \times 10^1$ | 2.0 | $1.2 \times 10^8$ |
|  | 23 | A | $9 \times 10^1$ | 1.6 | $8.6 \times 10^7$ |
|  | 24 | A | $7 \times 10^1$ | 1.7 | $7.3 \times 10^7$ |
|  | 25 | A | $7 \times 10^1$ | 1.6 | $5.5 \times 10^7$ |
|  | 26 | A | $8 \times 10^1$ | 1.7 | $1.0 \times 10^8$ |
|  | 27 | A | $9 \times 10^1$ | 1.9 | $1.8 \times 10^8$ |
|  | 28 | A | $6 \times 10^1$ | 1.7 | $8.2 \times 10^7$ |
|  | 29 | A | $7 \times 10^1$ | 2.1 | $2.6 \times 10^8$ |
|  | 30 | A | $2 \times 10^2$ | 1.8 | $1.0 \times 10^8$ |
|  | 31 | A | $1 \times 10^2$ | 1.7 | $8.5 \times 10^7$ |
|  | 32 | A | $2 \times 10^2$ | 2.0 | $2.0 \times 10^8$ |
|  | 33 | A | $9 \times 10^1$ | 1.6 | $8.0 \times 10^7$ |
|  | 34 | A | $1 \times 10^2$ | 1.9 | $9.4 \times 10^7$ |
|  | 35 | A | $1 \times 10^2$ | 1.7 | $7.7 \times 10^7$ |
|  | 36 | A | $9 \times 10^1$ | 1.8 | $9.0 \times 10^7$ |
| Comp. Ex. | 1 | B | — | — | — |
|  | 2 | A | $1 \times 10^3$ | 0.1 | $1.8 \times 10^6$ |
|  | 3 | A | $7 \times 10^2$ | 0.2 | $1.7 \times 10^6$ |
|  | 4 | A | $6 \times 10^2$ | 0.3 | $4.1 \times 10^6$ |
|  | 5 | A | $9 \times 10^2$ | 0.1 | $2.2 \times 10^6$ |

In Table 3, "—" denotes that it was not able to measure.

The coating liquid for forming a metal oxide film of Examples 1 to 36 according to the present invention had excellent coating property, and therefore the channel formation state thereof was excellent. Moreover, the field-effect transistor using the oxide semiconductor obtained by applying each of the coating liquids as an active layer had volume resistivity required for an active layer of a field-effect transistor in a low temperature process, such as of about 300° C., had high carrier mobility, had a large on/off ratio, and exhibited excellent transistor properties.

In the case where [B/A] satisfied the formula (1), and [C/A] satisfied the formula (2), the volume resistivity of the active layer is particularly suitable for the volume resistivity required for an active layer of a field-effect transistor, and the resulting field-effect transistor had extremely high carrier mobility, an extremely high on/off ratio, and exhibited particularly excellent transistor properties.

The coating liquid for forming an oxide semiconductor film of Comparative Example 1 had poor coating proptery, and therefore the channel formation state thereof was insufficient, and the evaluation of the field-effect transistor could not be performed.

The coating liquids for forming a metal oxide film of Comparative Examples 2 to 5 were each a coating liquid for forming a metal oxide film, which exhibited excellent transistor properties, when an active layer is produced at process temperature of 500° C. In the case where an active layer was formed using each of the coating liquids for forming a metal oxide film of Comparative Example 2 to 5 at low process temperature, however, the results of the volume resistivity, carrier mobility, and on/off ratio were worse than those of Examples 1 to 36.

The embodiments of the present invention are, for example, as follows:

<1> A coating liquid for forming a metal oxide film, containing:
an indium compound;
at least one selected from the group consisting of a magnesium compound, a calcium compound, a strontium compound, and a barium compound;
at least one selected from the group consisting of a compound containing a metal a maximum positive value of an oxidation number of which is IV, a compound containing a metal a maximum positive value of an oxidation number of which is V, and a compound containing a metal a maximum positive value of an oxidation number of which is VI; and
an organic solvent.

<2> The coating liquid for forming a metal oxide film according to <1>, wherein the compound containing a metal a maximum positive value of an oxidation number of which is IV is at least one selected from the group consisting of a germanium compound, a tin compound, a titanium compound, a zirconium compound, and a hafnium compound.

<3> The coating liquid for forming a metal oxide film according to <1> or <2>, wherein the compound containing a metal a maximum positive value of an oxidation number of which is V is at least one selected from the group consisting of a vanadium compound, a niobium compound, a tantalum compound, and an antimony compound.

<4> The coating liquid for forming a metal oxide film according to any one of <1> to <3>, wherein the compound containing a metal a maximum positive value of an oxidation number of which is VI is a molybdenum compound, or a tungsten compound, or both thereof.

<5> The coating liquid for forming a metal oxide film according to any one of <1> to <4>, wherein a number (A) of indium atoms of the indium compound, and a total number (B) of magnesium atoms of the magnesium compound, calcium atoms of the calcium compound, strontium atoms of the strontium compound, and barium atoms of the barium compound satisfy the following formula (1):

$$0.04 \leq [B/A] \leq 0.5 \quad \text{Formula (1)}.$$

<6> The coating liquid for forming a metal oxide film according to any one of <1> to <4>, wherein a number (A) of indium atoms of the indium compound, and a total number (C) of metal atoms of the compound containing a metal a maximum positive value of an oxidation number of which is IV, the compound containing a metal a maximum positive value of an oxidation number of which is V, and the compound containing a metal a maximum positive value of an oxidation number of which is VI satisfy the following formula (2):

$$0.0001 \leq [C/A] \leq 0.1 \quad \text{Formula (2)}.$$

<7> The coating liquid for forming a metal oxide film according to any one of <1> to <6>, wherein the indium compound is at least one selected from the group consisting of indium nitrate, indium sulfate, and indium chloride.

<8> The coating liquid for forming a metal oxide film according to any one of <1> to <7>, wherein the magnesium compound is at least one selected from magnesium nitrate, magnesium sulfate, and magnesium chloride, the calcium compound is at least one selected from the group consisting of calcium nitrate, calcium sulfate, and calcium chloride, the strontium compound is at least one selected from the group consisting of strontium nitrate, strontium sulfate, and strontium chloride, and the barium compound is barium bistetrahydrofurfuryloxide.

<9> The coating liquid for forming a metal oxide film according to any one of <1> to <8>, wherein the organic solvent is glycol ether, or diol, or both thereof.

<10> A metal oxide film, obtained by a method containing:
applying the coating liquid for forming a metal oxide film according to any one of <1> to <9> onto a base to be coated; and
drying, followed by baking.

<11> A field-effect transistor, containing:
a gate electrode configured to apply gate voltage;
a source electrode and a drain electrode, which are configured to extract electric current;
an active layer, which is formed between the source electrode and the drain electrode, and is formed of oxide semiconductor; and
a gate insulating layer formed between the gate electrode, and the active layer,
wherein the oxide semiconductor is oxide semiconductor formed by applying the coating liquid for forming a metal oxide film according to <1> to <9>.

<12> A method for forming a field-effect transistor, containing:
forming a gate electrode on a base;
forming a gate insulating layer on the gate electrode;
forming a source electrode and a drain electrode on the gate insulating layer with a space between the source electrode and the drain electrode;
forming an active layer formed of oxide semiconductor on an area of the gate insulating layer, which is a channel region between the source electrode and the drain electrode,
wherein the forming the active layer is applying the coating liquid for forming a metal oxide film according to any one of <1> to <9> on the gate insulating layer to form the active layer formed of the oxide semiconductor.

<13> A method for producing a field-effect transistor, containing:
forming a source electrode and a drain electrode on a base with a space between the source electrode and the drain electrode;

forming an active layer formed of oxide semiconductor on an area of the base, which is a channel region between the source electrode and the drain electrode;

forming a gate insulating layer on the active layer; and forming a gate electrode on the gate insulating layer, wherein the forming the active layer is applying the coating liquid for forming a metal oxide film according to any one of <1> to <9> on the base to form the active layer formed of the oxide semiconductor.

<14> The method for producing a field-effect transistor according to <12> or <13>, wherein the forming the active layer containing adjusting the number (A) of the indium atoms of the indium compound, the total number (B) of the magnesium atoms of the magnesium compound, the calcium atoms of the calcium compound, the strontium atoms of the strontium compound, and the barium atoms of the barium compound, and the total number (C) the metal atoms of the compound containing a metal a maximum positive value of an oxidation number of which is IV, the compound containing a metal a maximum positive value of an oxidation number of which is V, and the compound containing a metal a maximum positive value of an oxidation number of which is VI in the coating liquid for forming a metal oxide film, to thereby control at least one selected from the group consisting of volume resistivity, carrier mobility, and carrier density of the oxide semiconductor.

REFERENCE SIGNS LIST 1 base
2 gate electrode
3 gate insulating layer
4 source electrode
5 drain electrode
6 active layer

The invention claimed is:

1. A coating liquid for farming a metal oxide film, comprising:
   an indium compound;
   at least one selected from the group consisting of a calcium compound and a barium compound;
   at least one selected from the group consisting of a first compound containing a metal with a maximum positive value of an oxidation number of IV, a second compound containing a metal with a maximum positive value of an oxidation number of V, and a third compound containing a metal with a maximum positive value of an oxidation number of VI; and
   an organic solvent.

2. The coating liquid according to claim 1,
   wherein the third compound containing a metal with a maximum positive value of an oxidation number of VI is a molybdenum compound, or a tungsten compound, or both thereof.

3. The coating liquid according to claim 1,
   wherein a number (A) of indium atoms of the indium compound, and a total number (C) of metal atoms of the first compound containing a metal with a maximum positive value of an oxidation number of IV, the second compound containing a metal with a maximum positive value of an oxidation number of V, and the third compound containing a metal with a maximum positive value of an oxidation number of VI satisfy the following formula (2):

$0.0001 \leq [C/A] \leq 0.1$  Formula (2).

4. The coating liquid according to claim 1,
   wherein the indium compound is at least one selected from the group consisting of indium nitrate, indium sulfate, and indium chloride.

5. The coating liquid according to claim 1,
   wherein the organic solvent is glycol ether, or diol, or both thereof.

6. The metal oxide film according to claim 1, obtained by a method comprising:
   applying the coating liquid according to claim 1 onto a base to be coated; and
   drying, followed by baking.

7. A field-effect transistor, comprising:
   a gate electrode configured to apply gate voltage;
   a source electrode and a drain electrode, which are configured to extract electric current;
   an active layer, which is formed between the source electrode and the drain electrode, and is formed of oxide semiconductor; and
   a gate insulating layer formed between the gate electrode, and the active layer,
   wherein the oxide semiconductor is formed by applying the coating liquid according to claim 1.

8. A coating liquid for forming a metal oxide film comprising:
   an indium compound;
   at least one selected from the group consisting of a magnesium compound, a calcium compound, a strontium compound, and a barium compound;
   at least one selected from the group consisting of a first compound containing a metal with a maximum positive value of an oxidation number of IV and a second compound containing a metal with a maximum positive value of an oxidation number of VI; and
   an organic solvent,
   wherein the first compound containing a metal with a maximum positive value of an oxidation number of IV is at least one selected from the group consisting of a zirconium compound and a hafnium compound.

9. A field-effect transistor, comprising:
   a gate electrode configured to apply gate voltage;
   a source electrode and a drain electrode, which are configured to extract electric current;
   an active layer, which is formed between the source electrode and the drain electrode, and is formed of oxide semiconductor; and
   a gate insulating layer formed between the gate electrode, and the active layer,
   wherein the oxide semiconductor is formed by applying the coating liquid according to claim 8.

10. A coating liquid for forming a metal oxide film comprising:
    an indium compound;
    at least one selected from the group consisting of a magnesium compound, a calcium compound, a strontium compound, and a barium compound;
    at least one selected from the group consisting of a first compound containing a metal with a maximum positive value of an oxidation number of V, and a second compound containing a metal with a maximum positive value of an oxidation number of VI; and
    an organic solvent,
    wherein the first compound containing a metal with a maximum positive value of an oxidation number of V is at least one selected from the group consisting of a vanadium compound, a niobium compound, and an antimony compound.

11. The coating liquid according to claim 10,
wherein a number (A) of indium atoms of the indium compound, and a total number (B) of magnesium atoms of the magnesium compound, calcium atoms of the calcium compound, strontium atoms of the strontium compound, and barium atoms of the barium compound satisfy the following formula (1):

$$0.04 \leq [B/A] \leq 0.5 \quad \text{Formula (1).}$$

12. The coating liquid according to claim 10,
wherein the magnesium compound is at least one selected from the group consisting of magnesium nitrate, magnesium sulfate, and magnesium chloride, the calcium compound is at least one selected from the group consisting of calcium nitrate, calcium sulfate, and calcium chloride, the strontium compound is at least one selected from the group consisting of strontium nitrate, strontium sulfate, and strontium chloride, and the barium compound is barium bistetrahydrofurfuryloxide.

13. A method for forming a field-effect transistor, comprising:
forming a gate electrode on a base;
forming a gate insulating layer on the gate electrode;
forming a source electrode and a drain electrode on the gate insulating layer with a space between the source electrode and the drain electrode;
forming an active layer formed of oxide semiconductor on an area of the gate insulating layer, which is a channel region between the source electrode and the drain electrode,
wherein the forming the active layer is applying the coating liquid according to claim 10 on the gate insulating layer to form the active layer formed of the oxide semiconductor.

14. The method for producing a field-effect transistor according to claim 13,
wherein the forming the active layer comprises adjusting a number (A) of indium atoms of the indium compound, a total number (B) of magnesium atoms of the magnesium compound, calcium atoms of the calcium compound, strontium atoms of the strontium compound, and barium atoms of the barium compound, and a total number (C) of the metal atoms of the first compound containing a metal with a maximum positive value of an oxidation number of IV, the first compound containing a metal with a maximum positive value of an oxidation number of V, and the second compound containing a metal with a maximum positive value of an oxidation number of VI in the coating liquid for forming the metal oxide film, to thereby control at least one selected from the group consisting of volume resistivity, carrier mobility, and carrier density of the oxide semiconductor.

15. A method for producing a field-effect transistor, comprising:
forming a source electrode and a drain electrode on a base with a space between the source electrode and the drain electrode;
forming an active layer formed of oxide semiconductor on an area of the base, which is a channel region between the source electrode and the drain electrode;
forming a gate insulating layer on the active layer; and
forming a gate electrode on the gate insulating layer,
wherein the forming the active layer includes applying the coating liquid according to claim 10 on the base to form the active layer formed of the oxide semiconductor.

16. The method for producing a field-effect transistor according to claim 15,
wherein the forming the active layer comprises adjusting a number (A) of indium atoms of the indium compound, a total number (B) of magnesium atoms of the magnesium compound, calcium atoms of the calcium compound, strontium atoms of the strontium compound, and barium atoms of the barium compound, and a total number (C) of the metal atoms of the first compound containing a metal with a maximum positive value of an oxidation number of IV, the first compound containing a metal with a maximum positive value of an oxidation number of V, and the second compound containing a metal with a maximum positive value of an oxidation number of VI in the coating liquid for forming the metal oxide film, to thereby control at least one selected from the group consisting of volume resistivity, carrier mobility, and carrier density of the oxide semiconductor.

17. A field-effect transistor, comprising:
a gate electrode configured to apply gate voltage;
a source electrode and a drain electrode, which are configured to extract electric current;
an active layer, which is formed between the source electrode and the drain electrode, and is formed of oxide semiconductor; and
a gate insulating layer formed between the gate electrode, and the active layer,
wherein the oxide semiconductor is formed by applying the coating liquid according to claim 10.

* * * * *